US012426286B2

(12) United States Patent
Salzman et al.

(10) Patent No.: US 12,426,286 B2
(45) Date of Patent: Sep. 23, 2025

(54) RADIATION ENHANCED BIPOLAR TRANSISTOR

(71) Applicant: Texas Instruments Incorporated, Dallas, TX (US)

(72) Inventors: James Fred Salzman, Anna, TX (US); Randolph William Kahn, McKinney, TX (US); Richard Guerra Roybal, Denton, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/193,015

(22) Filed: Jun. 25, 2016

(65) Prior Publication Data

US 2017/0373174 A1 Dec. 28, 2017

(51) Int. Cl.
*H01L 29/66* (2006.01)
*H01L 21/265* (2006.01)
(Continued)

(52) U.S. Cl.
CPC ....... *H10D 10/60* (2025.01); *H01L 21/26513* (2013.01); *H01L 23/48* (2013.01); *H10D 10/051* (2025.01); *H10D 10/061* (2025.01); *H10D 10/40* (2025.01); *H10D 62/133* (2025.01); *H10D 62/134* (2025.01)

(58) Field of Classification Search
CPC ............. H01L 29/735; H01L 21/26513; H01L 29/6625; H01L 29/0808
See application file for complete search history.

(56) References Cited

U.S. PATENT DOCUMENTS 5,107,321 A 4/1992 Ilderem et al.
5,605,850 A * 2/1997 Villa .................. H01L 29/1004
148/DIG. 10
(Continued)

FOREIGN PATENT DOCUMENTS

JP H0541385 A 2/1993

OTHER PUBLICATIONS

Chen et al., "The Effects of ELDRS at Ultra-Low Dose Rates", supported in part by the NASA Electronics Parts and Packaging program (NEPP) and the Defense Threat Reduction Agency (DTRA) under IACRO#09-45871; Manuscript received on Jul. 15, 2010; 6 pgs.

(Continued)

*Primary Examiner* — Ismail A Muse
(74) *Attorney, Agent, or Firm* — Ronald O. Neerings; Frank D. Cimino

(57) ABSTRACT

Disclosed examples include integrated circuits and bipolar transistors with a first region of a first conductivity type in a substrate, a collector region of a second conductivity type disposed in the substrate, and a base region of the first conductivity type extending into the first region. A first emitter region of the second conductivity type extends into the first region and includes a lateral side spaced from and facing the base region. A second emitter region of the second conductivity type extends downward into the first region, abutting the top surface and an upper portion of the first lateral side of the first emitter region to mitigate surface effects and gain degradation caused by hydrogen injection from radiation to provide a radiation hardened bipolar transistor.

15 Claims, 20 Drawing Sheets

(51) Int. Cl.
*H01L 23/48* (2006.01)
*H10D 10/01* (2025.01)
*H10D 10/40* (2025.01)
*H10D 10/60* (2025.01)
*H10D 62/13* (2025.01)

(56) References Cited

U.S. PATENT DOCUMENTS

| | | | | |
|---|---|---|---|---|
| 5,726,069 | A * | 3/1998 | Chen | H01L 21/26586 257/E21.345 |
| 5,828,124 | A * | 10/1998 | Villa | H01L 29/1004 257/557 |
| 6,005,283 | A * | 12/1999 | Kim | H01L 21/8224 257/557 |
| 6,469,362 | B2 * | 10/2002 | Wong | H01L 21/8249 257/370 |
| 9,281,232 | B2 | 3/2016 | Salzman | |
| 2005/0287754 | A1 | 12/2005 | van Vonno et al. | |
| 2007/0052066 | A1 | 3/2007 | Beasom | |
| 2007/0176667 | A1 * | 8/2007 | Heurtier | H01L 29/0692 327/333 |
| 2008/0054407 | A1 * | 3/2008 | Ko | H01L 29/1008 257/565 |
| 2012/0032303 | A1 * | 2/2012 | Elkareh | H01L 29/41708 257/587 |
| 2013/0020679 | A1 * | 1/2013 | Nagai | H01L 22/14 257/532 |
| 2014/0308792 | A1 * | 10/2014 | Lin | H01L 29/6625 438/370 |
| 2015/0097265 | A1 * | 4/2015 | Lin | H01L 29/735 257/526 |
| 2015/0214290 | A1 * | 7/2015 | Horng | H01L 23/5223 438/381 |

OTHER PUBLICATIONS

Office Action emailed Oct. 20, 2021 2 pages.
National Intellectual Property Admin., PRC Search Report mailed Jun. 14, 2022, 3 pages.

* cited by examiner

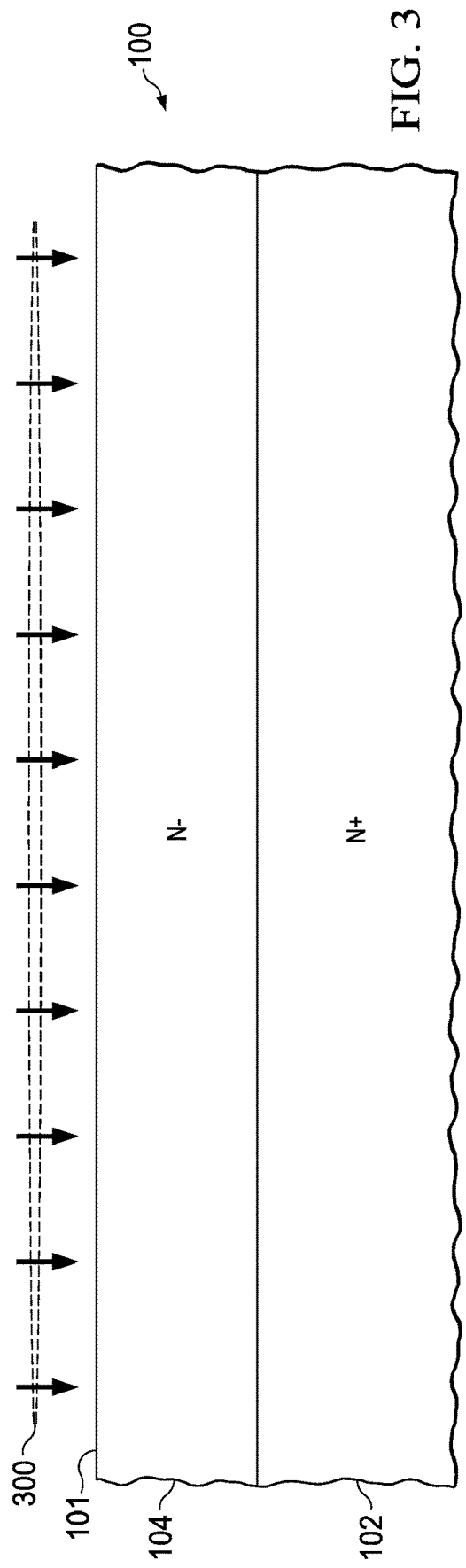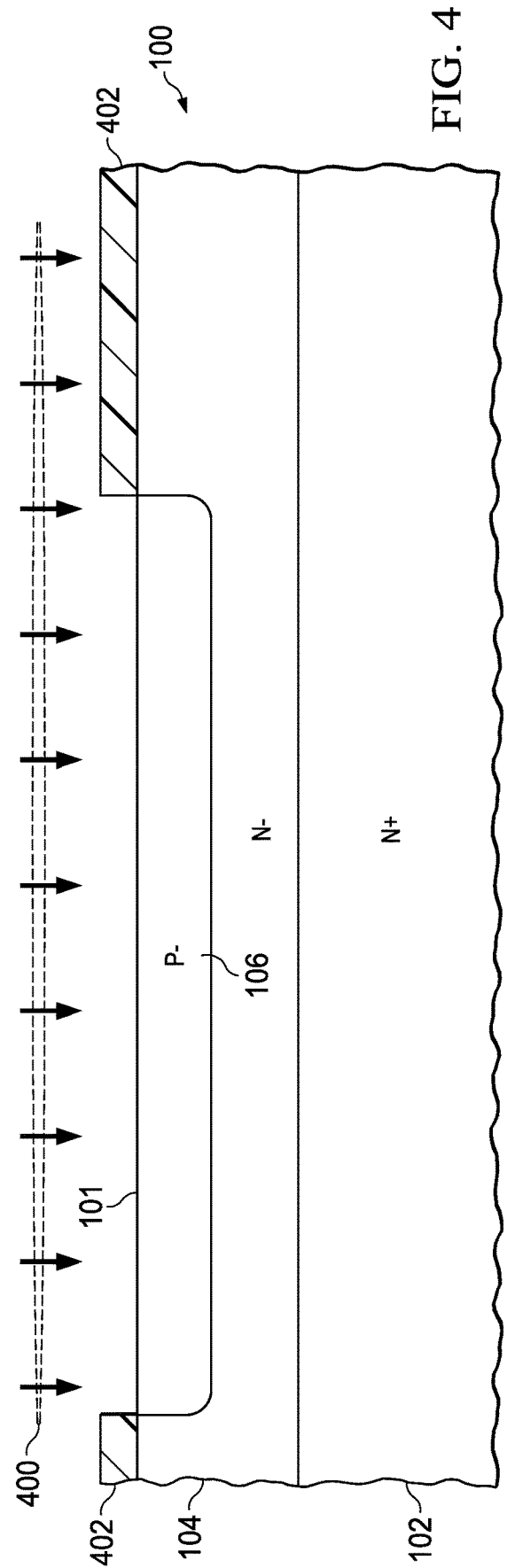

RADIATION ENHANCED BIPOLAR TRANSISTOR

BACKGROUND

Radiation hardened electronic circuits are desired for a variety of applications in which systems and circuits are exposed to radiation. Example applications include satellites and other spacecraft, aircraft, medical devices such as x-ray equipment, and nuclear power plants. In such applications, radiation can decrease the gain of bipolar transistors. Radiation hardening of electronic circuits is quantified in terms of total ionizing dose or total irradiated dose (TID), which is a measure of the number of protons or heavy ions imparted to a circuit or system. Ionizing radiation causes electron-hole pairs in silicon dioxide ($SiO_2$). Protons (ionic hydrogen) are released in the oxide and protons or holes are transported toward the silicon-oxide interface in the presence of biasing fields, leading to formation of interface traps at the interface. Under high dose rate there is a high generation of electron-hole pairs (charge yield). The holes are forced to the interface by positive voltage, while the electrons are swept away. The buildup of holes at the interface forms a positive charge barrier and repels the generated protons. This keeps the protons from the interface and mitigates formation of interface states, while promoting recombination in the oxide. Lower dose rates correspond to reduced electron-hole pair generation. In this case, holes are forced to the interface by positive voltage, while the electrons are swept away, in the same way under high dose rate, but the trapped hole buildup is much lower. The repelling force of the trapped holes is low enough to allow the generated protons to migrate to the interface forming interface states. Interface traps can adversely affect the operation of bipolar transistors by reducing the gain β or Hfe. In addition, certain circuits, such as bipolar transistors suffer from enhanced low dose rate radiation (ELDRS) effects. Specifically, the transistor gain reduction effects can be lower at high radiation dose rates than at more moderate radiation levels. Total dose radiation causes charge yield in $SiO_2$, and allows interface trap generation under low dose rate conditions. It also produces hole traps in the oxide that covers the base emitter junction causing additional base emitter leakage. Both effects contribute to a drop in transistor gain, and thus more base current is needed for the same collector current.

Moreover, the effects on transistor gain can increase with the amount of hydrogen used in fabrication processing. For instance, nitride passivation of an upper metallization layer in integrated circuit (IC) fabrication uses Ammonia $NH_3$, +Silane $SiH_4$ where 11 hydrogen atoms are released to form a single molecule of $Si_3NH_4$. Tetraethyl Orthosilicate (TEOS) can instead be used to passivate the upper metallization layer, as TEOS material does not use Ammonia and has no hydrogen generation in the formation of $SiO_2$. TEOS passivation, however, is not as good as nitride passivation. Accordingly, improved integrated circuits and bipolar transistors are desired for use in applications involving radiation exposure without requiring low hydrogen fabrication techniques.

SUMMARY

Disclosed examples include integrated circuits and vertical or lateral bipolar transistors with a first region of a first conductivity type in a substrate, a collector region of a second conductivity type disposed in the substrate, and a base region of the first conductivity type extending into the first region. A first emitter region of the second conductivity type extends into the first region and includes a lateral side spaced from and facing the base region. A second emitter region of the second conductivity type extends downward into the first region, abutting the top surface and an upper portion of the first lateral side of the first emitter region. The second emitter region is more lightly doped than the first emitter region to mitigate surface effects and gain degradation caused by hydrogen injection from radiation in the most sensitive region proximate the emitter-base junction area.

Further disclosed examples include methods of fabricating bipolar transistors, including implanting dopants of a first conductivity type into a semiconductor substrate to form a first region extending downward from a top surface of the substrate, implanting dopants of the first conductivity type to form a base region extending downward into the first region from the top surface and abutting the top surface, and implanting dopants of a second conductivity type to form a first emitter region including a first lateral side spaced from and facing the base region. The method further includes implanting dopants of the second conductivity type to form a second emitter region extending downward into the first region, the second emitter region abutting the top surface and abutting an upper portion of the first lateral side of the first emitter region, the second emitter region having a fourth doping concentration less than the third doping concentration.

BRIEF DESCRIPTION OF THE DRAWINGS

FIGS. 3-8 are partial sectional side elevation views of a radiation hardened NPN bipolar transistor undergoing fabrication processing according to the method of FIG. 2.

DETAILED DESCRIPTION

Figure 1:
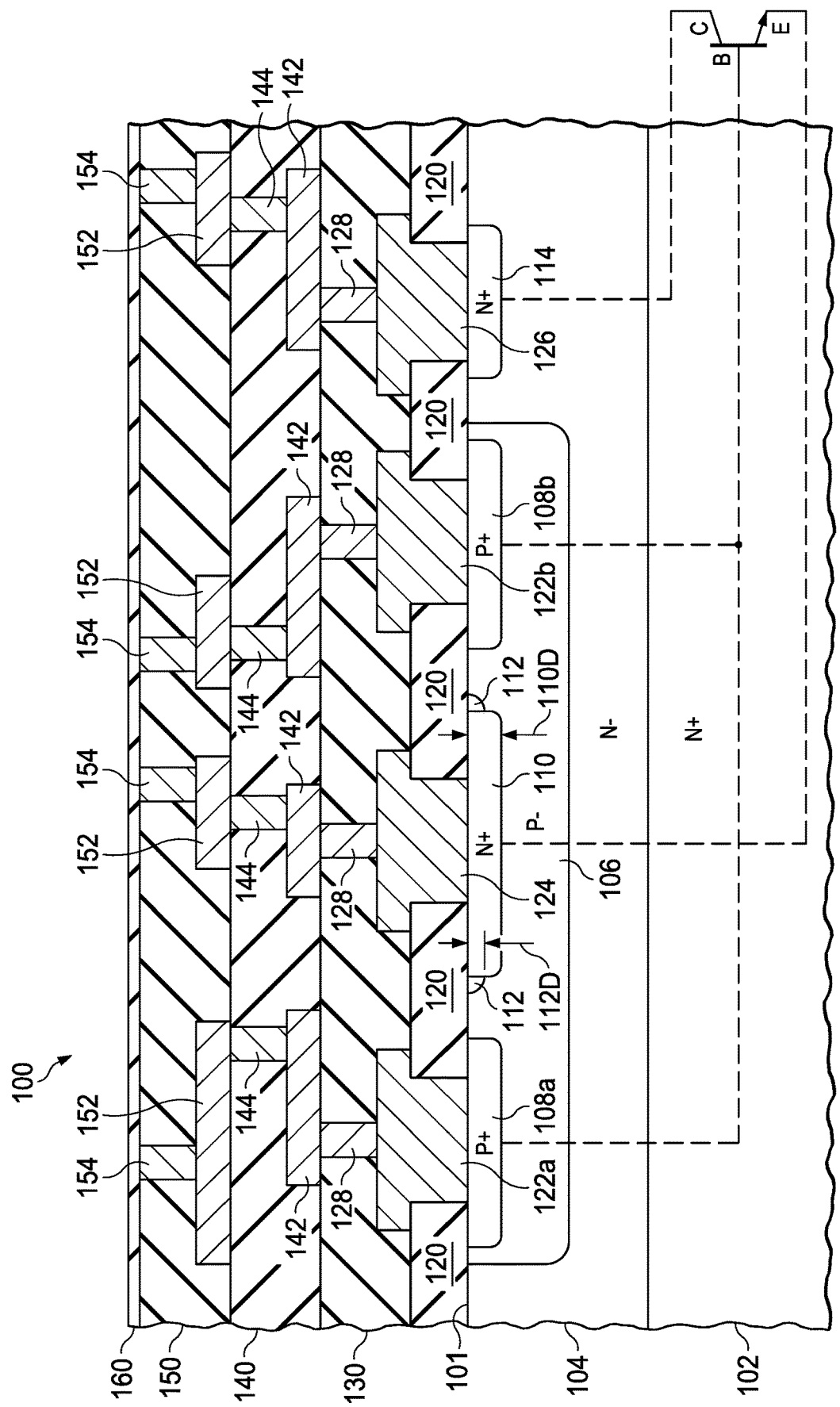
FIG. 1 is a partial sectional side elevation view of an integrated circuit with a radiation hardened lateral NPN bipolar transistor having first and second base regions, first and second emitter regions, and a top side collector.

In the drawings, like reference numerals refer to like elements throughout, and the various features are not necessarily drawn to scale. In the following discussion and in the claims, the terms "including", "includes", "having", "has", "with", or variants thereof are intended to be inclusive in a manner similar to the term "comprising", and thus should be interpreted to mean "including, but not limited to . . . " Also, the term "couple" or "couples" is intended to include indirect or direct electrical connection or combinations thereof. For example, if a first device couples to or is coupled with a second device, that connection may be through a direct electrical connection, or through an indirect electrical connection via one or more intervening devices and connections.

FIG. 1 shows a radiation hardened NPN bipolar transistor 100 lateral fabricated in a substrate 102, 104 of an integrated circuit (IC). In one example, the substrate constructed as an N+ silicon wafer on which an epitaxial silicon layer 104 is grown, having a lower (N−) dopant concentration and an upper or top surface 101. In another example, the substrate can include a lower silicon wafer with a P conductivity type upper portion, in which an N-well is formed, for example, to fabricate the bipolar transistor 100 in an isolation region of an integrated circuit having multiple circuit types, such as bipolar circuits along with CMOS circuits, etc. A P-base or first region 106 is formed in the epitaxial portion 104 of the substrate, such as by implanting P-type dopants (e.g., boron, etc.) to form a P-well 106 extending downward into the substrate 104 from the top surface 101. The first region 106 has a first doping concentration, indicated in the drawing as "P−". First and second base portions or regions 108a and 108b are formed in the region 106 in the NPN bipolar transistor example of FIG. 1. The base regions 108 have a second doping concentration (e.g., P+) greater than the doping concentration of the P− first region 106. The base regions 108a and 108b extend downward into the first region 106 from the top surface 101, and about the top surface 101.

Figure 19:
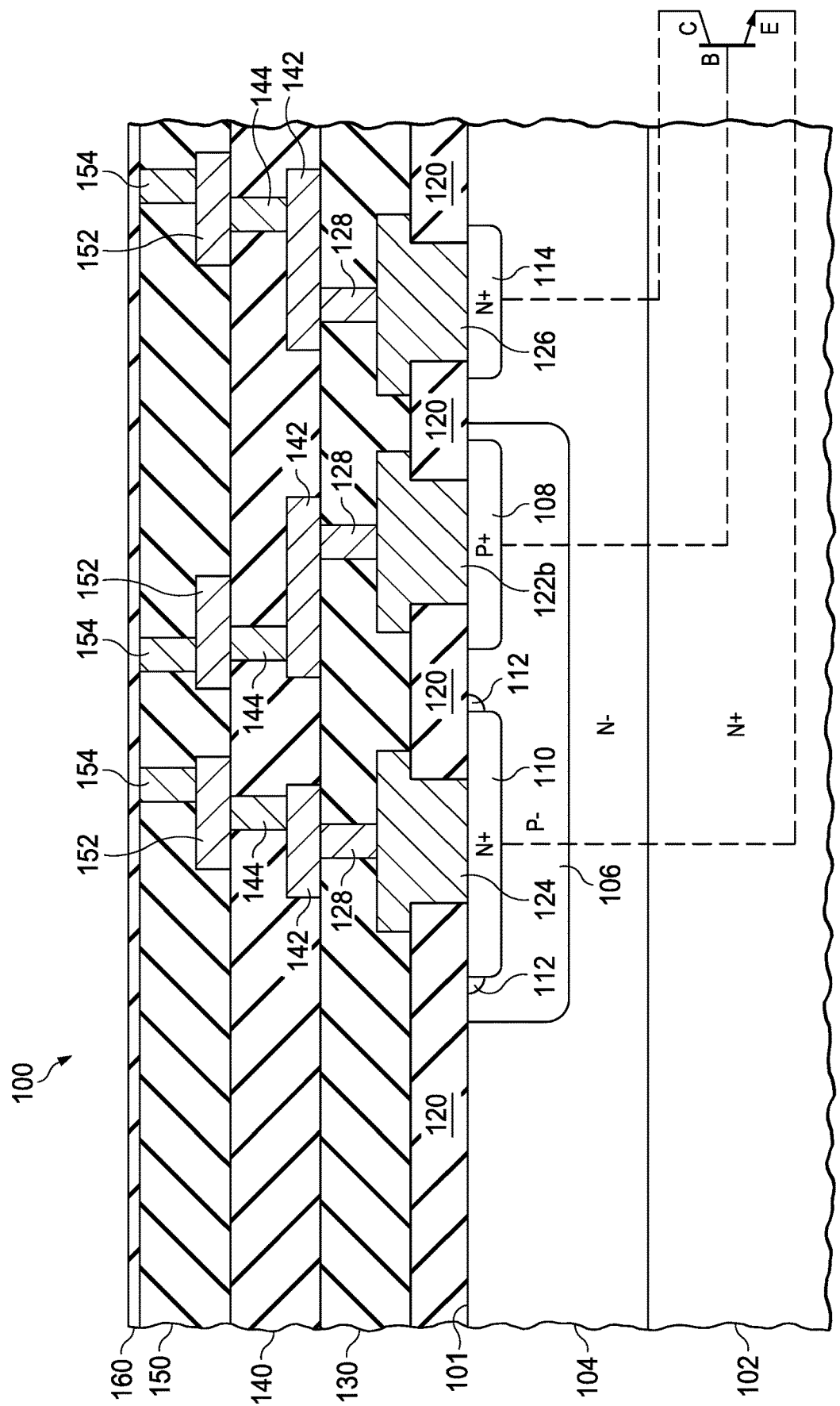
FIG. 19 is a partial sectional side elevation view of another example integrated circuit with a radiation hardened NPN bipolar transistor having a single base region.
Figure 21:
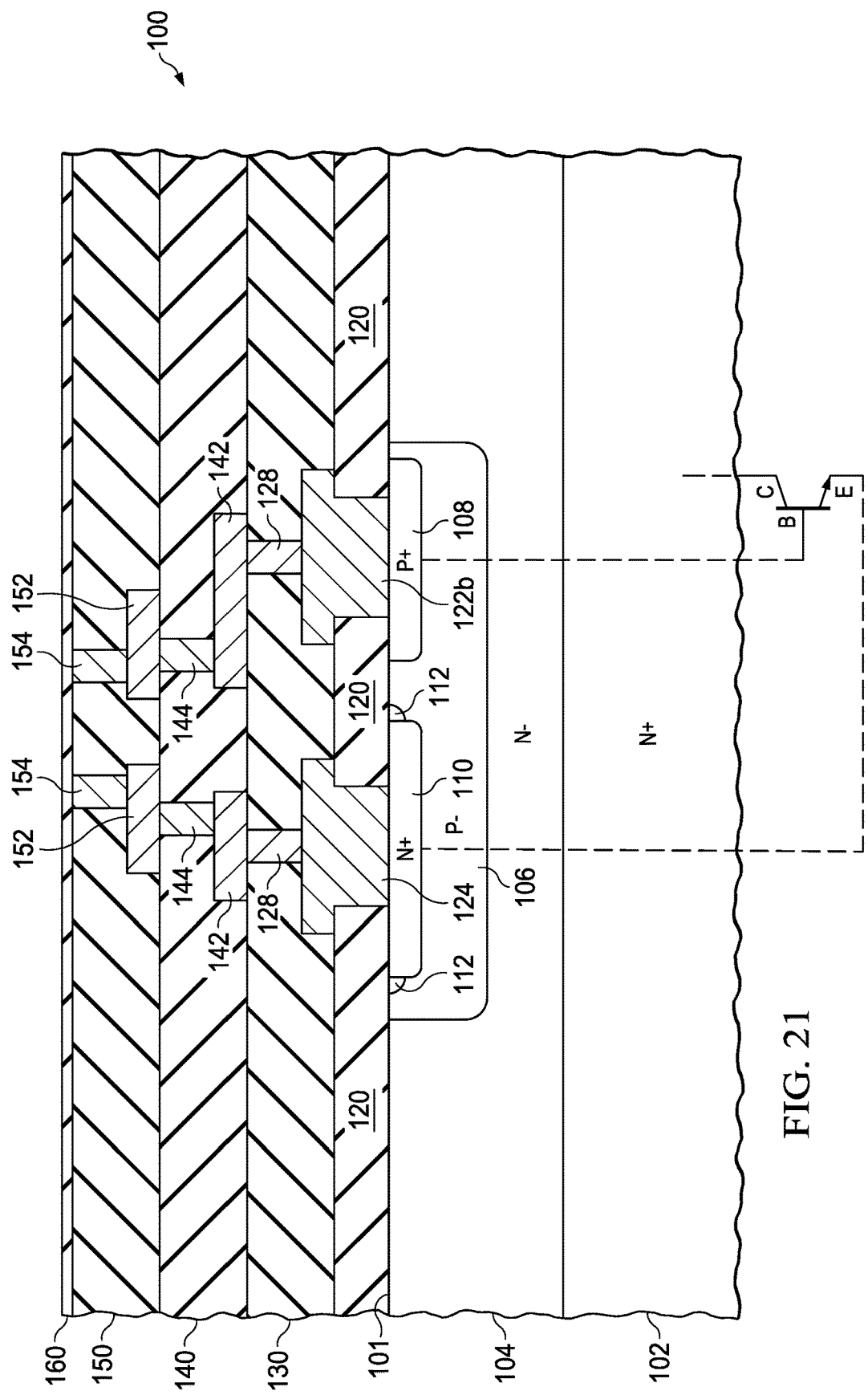
FIG. 21 is a partial sectional side elevation view of another example integrated circuit with a radiation hardened NPN bipolar transistor having a single base region and a bottom side collector.

An N-type emitter structure 110, 112 is formed in the P− first region 106, including an N+ first emitter region 110 extending downward into the first region 106, and a shallower, more lightly doped second emitter region 112. The first emitter region 110 has a third doping concentration (N+). The lightly doped second emitter region 112 has a fourth doping concentration (N−) that is less than the third doping concentration of the first emitter region 110. The first emitter region 110 abuts the top surface 101 and extends downward into the first region 106 to a depth 110D. In the example of FIG. 1, the first emitter region 110 includes a first lateral side (on the left in FIG. 1) spaced from and facing the first base region 108a, as well as an opposite second lateral side (on the right in FIG. 1) spaced from and facing the second base region 108b. In some examples, the second emitter region 112 is formed as a ring around the upper lateral sides of the first emitter region 110, and the region 112 abuts the top surface 101 of the epitaxial layer 104 of the substrate. The second emitter region 112 abuts the top surface 101 and extends downward into the first region 106 to a second depth 112D that is less than the first depth 110D of the first emitter region 110. In this example, the emitter regions 110 and 112 extend into and out of the page in the view of FIG. 1, and the first and second base regions 108a and 108b extend into and out of the page along the two lateral sides of the emitter regions 110, 112. In certain examples, the first or the second base region 108a or 108b can be omitted, with the NPN transistor including a single base structure, for example, as shown in FIGS. 19 and 21 below. In other examples, a single base structure 108 can be formed which encircles the emitter regions 110, 112. In these examples, the second emitter region 112 may, but need not, extend along the entirety of the lateral side or sides of the first emitter region 110 which face the base region 108.

Figure 20:
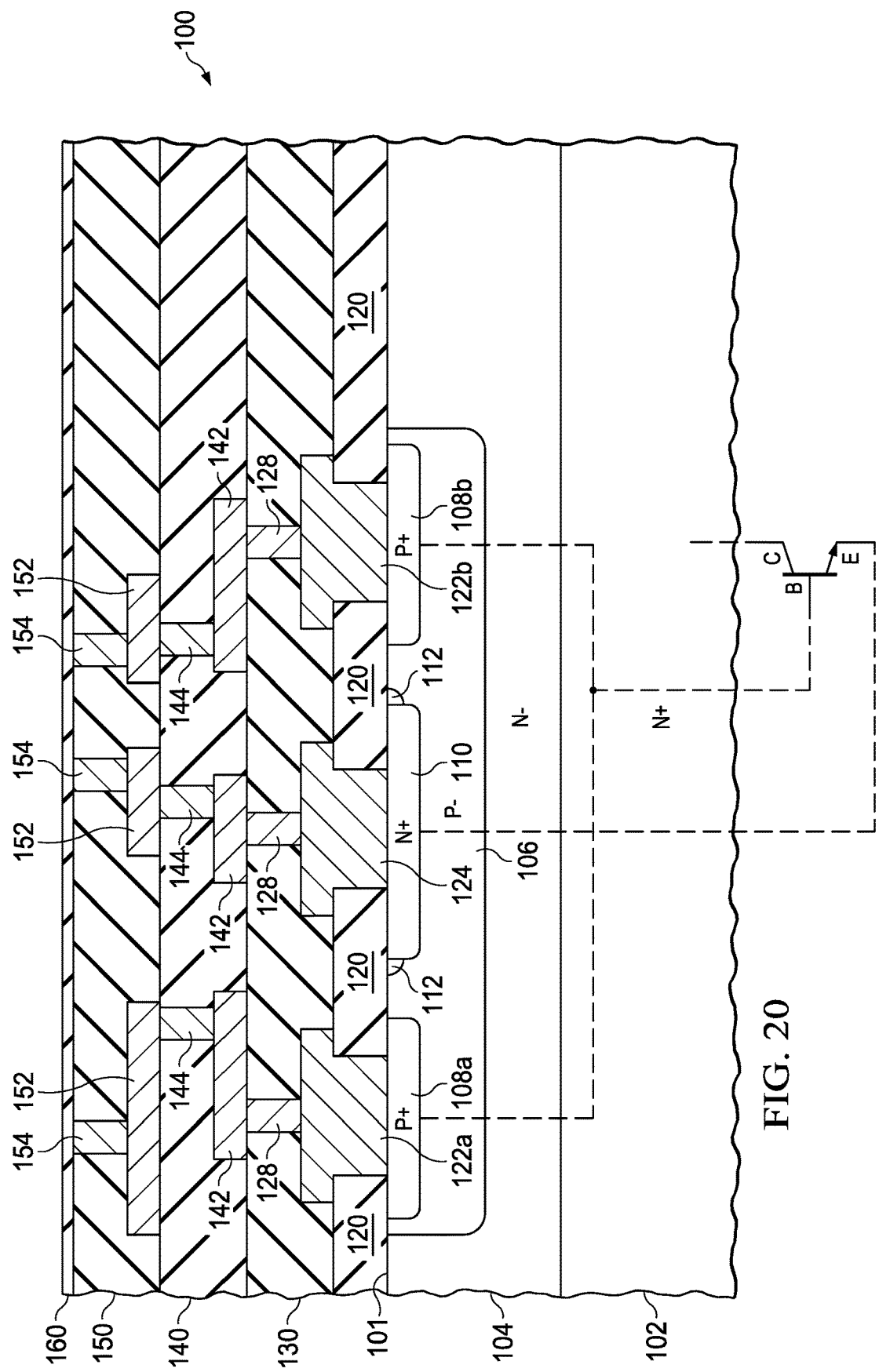
FIG. 20 is a partial sectional side elevation view of yet another example integrated circuit with a radiation hardened NPN bipolar transistor having first and second base regions and a bottom side collector.

The transistor 100 further includes an N-type collector region 114 (indicated as "N+" in FIG. 1). The collector region 114 extends downward in the top surface 101 into the substrate 104. In this lateral NPN transistor 100 of FIG. 1, moreover, the collector region 114 is laterally spaced from the first region 106. This lateral NPN transistor design allows a top side collector contact. In other examples, the collector region is constituted by the N− epitaxial region 104 beneath the first region 106 and/or the N+ semiconductor portion 102 of the substrate, for example, as shown in FIGS. 20 and 21 below.

The emitter structure 110, 112 enhances the robustness of the NPN transistor 100 against radiation effects. In particular, the transistor 100 has improved immunity to gain degradation in the presence of TID irradiation including mitigation or avoidance of ELDRS effects, compared with conventional bipolar transistor designs. For instance, a conventional lateral NPN bipolar transistor without a lightly doped second emitter region is subject to creation of an inversion region along the upper emitter-base junction due to charge trapping and interface traps at and near the interface above the base region. This results in degraded gain and increased leakage. In particular, an inversion region can occur in this upper portion of the emitter-base junction at or near the interface to the base oxide under ionizing radiation. In general, the emitter diffusion is not a sharp rectangle, but rounded and graded due to implant and doping concentration. This can act like multiple parallel NPN transistors with different characteristics. In this regard, rounding of an implanted or diffused emitter leads to different transistor gain and other performance characteristics under different base and collector current levels. In particular, the thickness of the base region is the main driver for gain and breakdown voltage performance of the transistor.

The disclosed emitter structure 110, 112 mitigates the impact of the surface inversion region to provide a radiation hardened robust bipolar transistor 100. The lightly doped emitter region 112 (LDE) is provided in the transistor 100 in order to mitigate or avoid formation of an undesired emitter-based depletion region, and the transistor performance characteristics can be adjusted by the properties of the first emitter region 110. The addition of the lightly doped second emitter region or regions 112 improves surface effects caused by ionic hydrogen injection from ionizing radiation, and thus minimizes service inversion. The first and second emitter regions 110 and 112 in combination thus provide improved gain, including low current Hfe or β in the presence of high or low dose radiation, as well as improved tolerance to heavy ion burnout (e.g., base-emitter impact ionization) in a reverse biased condition. In addition, the transistor 100 can be fabricated in an integrated circuit as shown in which further techniques can be combined for radiation hardening, including the use of TEOS or other non-hydrogen upper layer passivation techniques. In other examples, nitride passivation can be used to passivate an upper metallization layer, with the presence of the second emitter region or regions 112 negating or reducing adverse effects of radiation exposure.

The transistor 100 also includes one or more conductive contacts 122, 124, 126 and a metallization structure with connective interconnection features to provide conductivity to the base and emitter (and optionally the collector). The contacts and metallization structures can be formed using any suitable semiconductor device fabrication techniques and materials. For instance, the contacts 122, 124 and 126 can be copper or other conductive material formed directly or indirectly over the upper surfaces of the corresponding base, first emitter and collector regions 108, 110 and 114, respectively, using copper or other conductive material directly or using known silicide contact formation techniques and materials. The transistor 100 can be formed in an IC as part of a larger overall circuit, in which case external conductivity to the individual base, emitter and/or collector of the transistor 100 is not required. For instance, the base, emitter and/or collector of the transistor 100 can be interconnected to other devices or components of an integrated circuit through appropriate vias and contacts providing electrical connection through one or more metallization layers 130, 140, 150. In other examples, the transistor 100 is formed in an integrated circuit package providing external connections (IC pins or pads, conductive terminals, etc.) to allow interconnection of the various terminals of the transistor 100 with an external circuit. For example, the transistor 100 can be formed in a device such as a commercially available 2N2222, 2N3700 or 2N2484 products.

As shown in the example of FIG. 1, a conductive first base contact 122a is formed which abuts (e.g., directly and/or indirectly electrically connects to) the base region 108a above the top surface 101, and a second contact 122b is formed over the second base region 108b. Similarly, a conductive emitter contact 124 is formed over a portion of the upper surface of the first emitter region 110. Where an upper connection to the collector region 114 is desired, a conductive collector contact 126 is formed abutting the collector region 114 above the top surface 101. As is known, silicon dioxide or other oxide material 120 is formed between the contacts 122, 124 and 126. A three-level is provided in the example of FIG. 1, including metallization layers 130, 140, 150 progressively disposed over the top surface 101 of the substrate 102, 104. In this example, a first metallization level or layer 130 includes non-conductive interlayer dielectric (ILD) material 130, such as TEOS, as well as conductive via structures 128 providing connection to the contacts 122, 124 and 126. A second level includes ILD material 140, as well as conductive contact and VS structures 142 and 144, and the third (e.g., upper) level includes ILD material 150 along with conductive structures 152 and 154. In the example of FIG. 1, the Final or upper-most metallization structure layer or level provides top side connections for the base, emitter and collector of the transistor 100, although not required in all implementations. In addition, the IC includes a passivation layer 160 disposed over the top layer 150. As previously mentioned, the use of the lightly doped second emitter region 112 facilitates immunity against gain degradation through hydrogen migration to the interface between the oxide 120 and the first emitter region 110 proximate the emitter-base junction. Accordingly, the passivation layer 160 at the top of the IC can be formed using nitride passivation techniques including ammonia and Silane to form a $Si_3NH_4$ material layer 160. In another example, the passivation layer 160 includes a Tetraethyl Orthosilicate TEOS material to further facilitate radiation hardening of the transistor 100.

Figure 2:
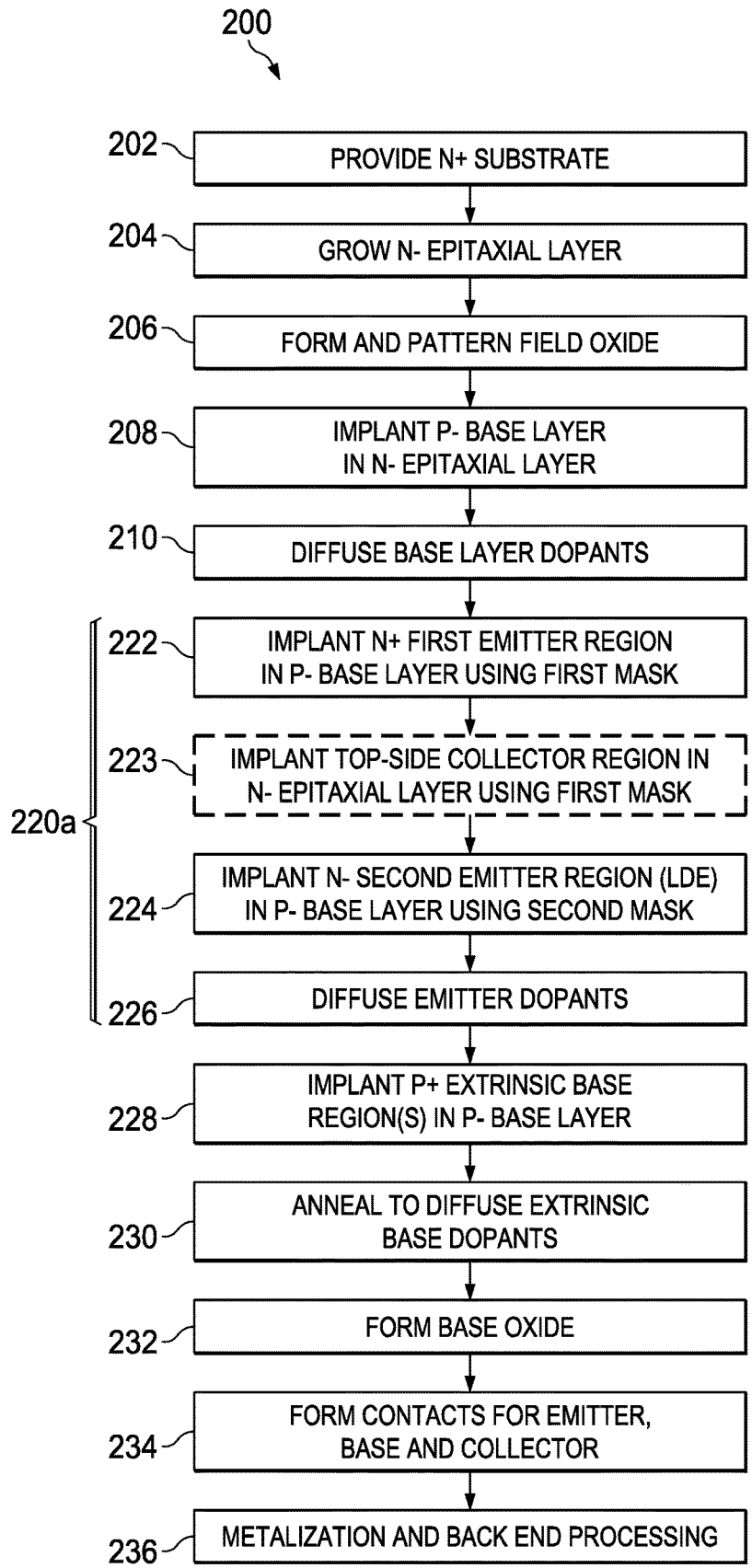
FIG. 2 is a flow diagram illustrating a method to fabricate a bipolar transistor including formation of first and second emitter regions.
Figure 5:
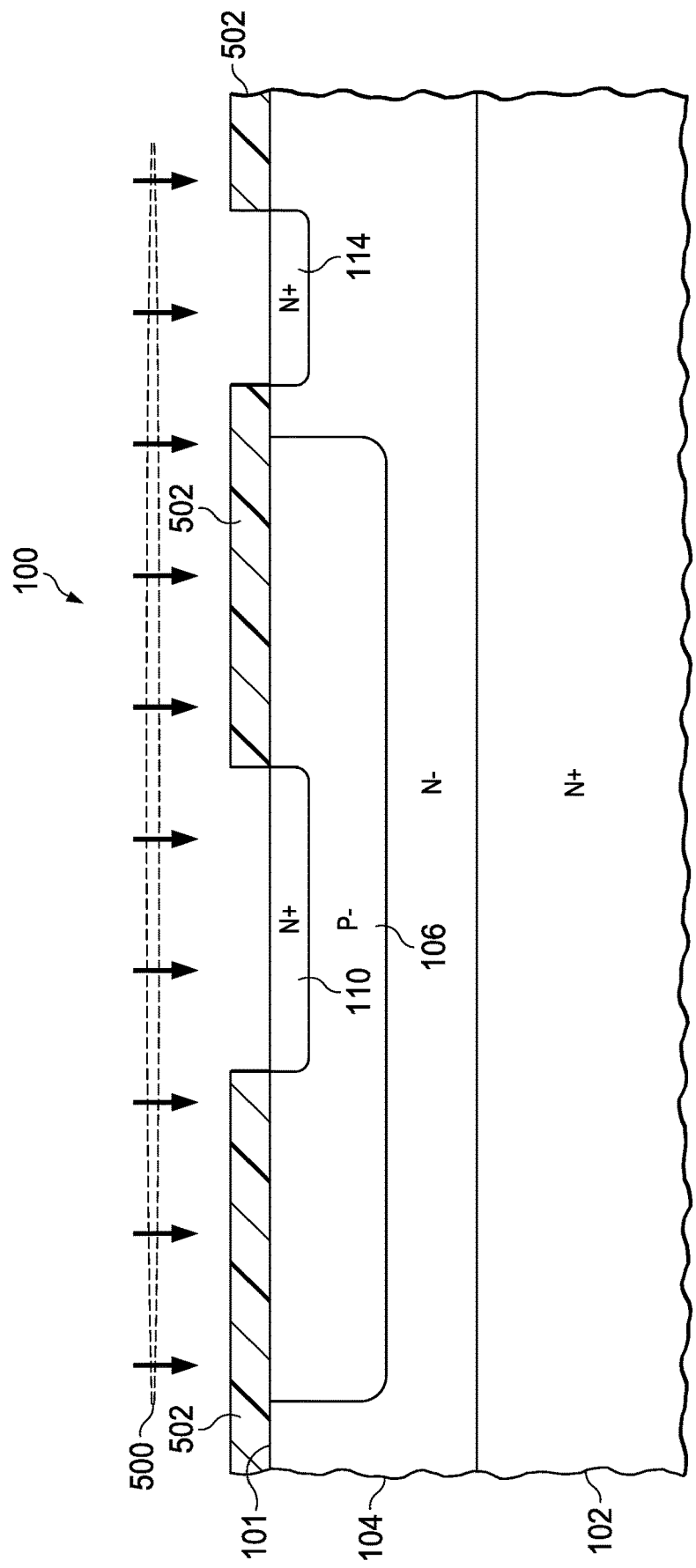

Referring also to FIGS. 2-8, the integrated circuit and transistor 100 of FIG. 1 can be fabricated according to any suitable semiconductor processing techniques. FIG. 2 illustrates an example fabrication process or method 200 to fabricate a bipolar transistor 100. FIGS. 3-8 illustrate the NPN transistor 100 undergoing fabrication process according to the method 200. The process 200 includes providing an N+ substrate at 202 (e.g., substrate 102). At 204, an N− epitaxial layer 104 is grown or otherwise formed over the base substrate 102 using an epitaxial process 300 illustrated in FIG. 3. At 206 in FIG. 2 field oxide is formed and patterned to expose a first portion or region of the upper surface 101 of the epitaxial layer 104 (e.g., patterned field oxide 402 in FIG. 4).

At 208 in FIG. 2 a P− base layer or first region 106 is implanted or otherwise formed in the N− epitaxial layer 104. For example, FIG. 4 shows an implantation process 400 used to implant P-type dopants or impurities (e.g., boron in one example) into an exposed first portion 106 of the epitaxial layer 104 of the N− substrate. This forms the first region 106 extending downward from the top surface 101, where the first region 106 has a first doping concentration. At 210, the P− base layer dopants can be diffused using a thermal diffusion process. It will be appreciated that the implanted regions illustrated and described herein need not have a uniform dopant concentration as a function of vertical depth, and the concentration can vary along the vertical and lateral directions. The diffusion processing at 210, moreover, may result in growth of certain amounts of oxide over the exposed upper areas of the structure (not shown).

Figure 6:
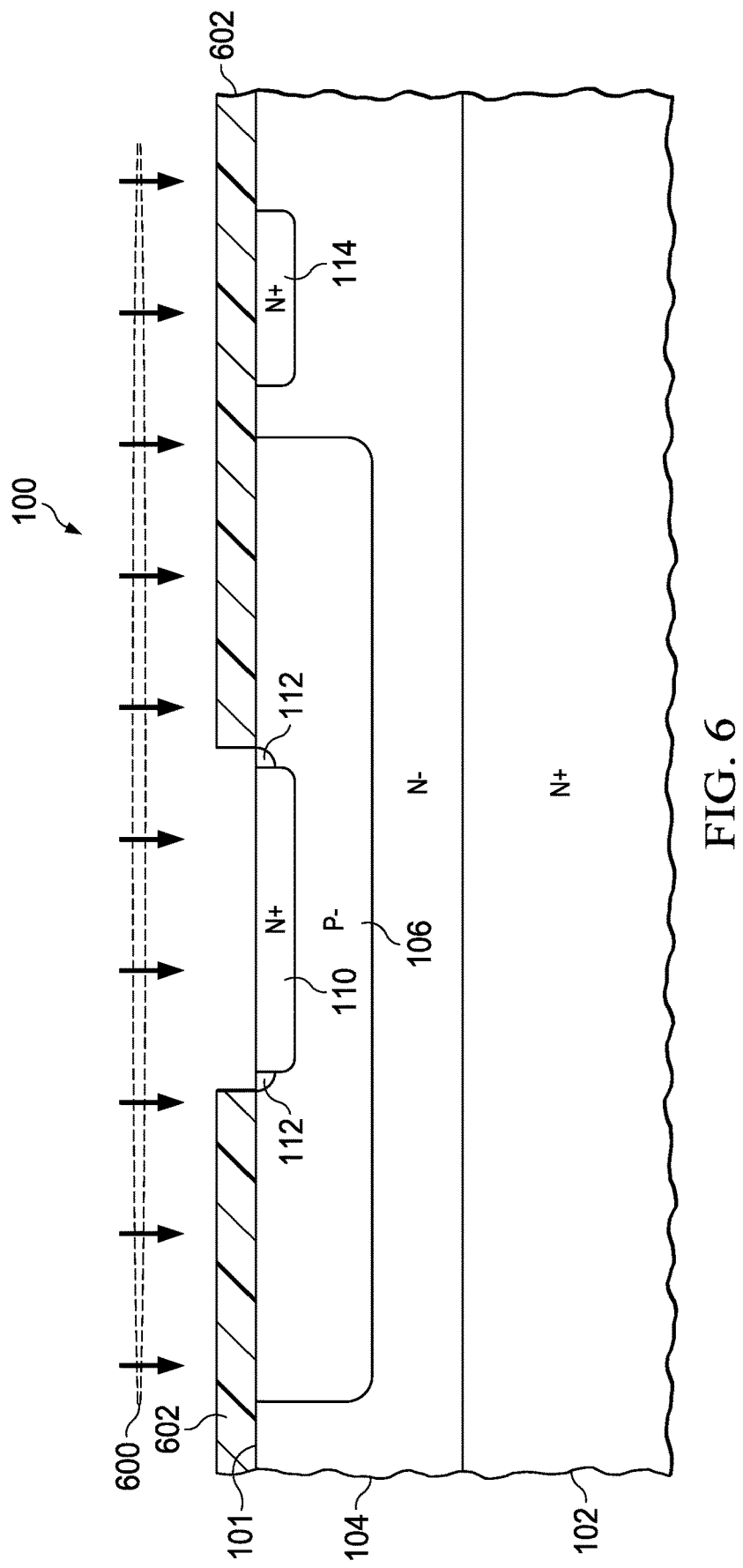
Figure 7:
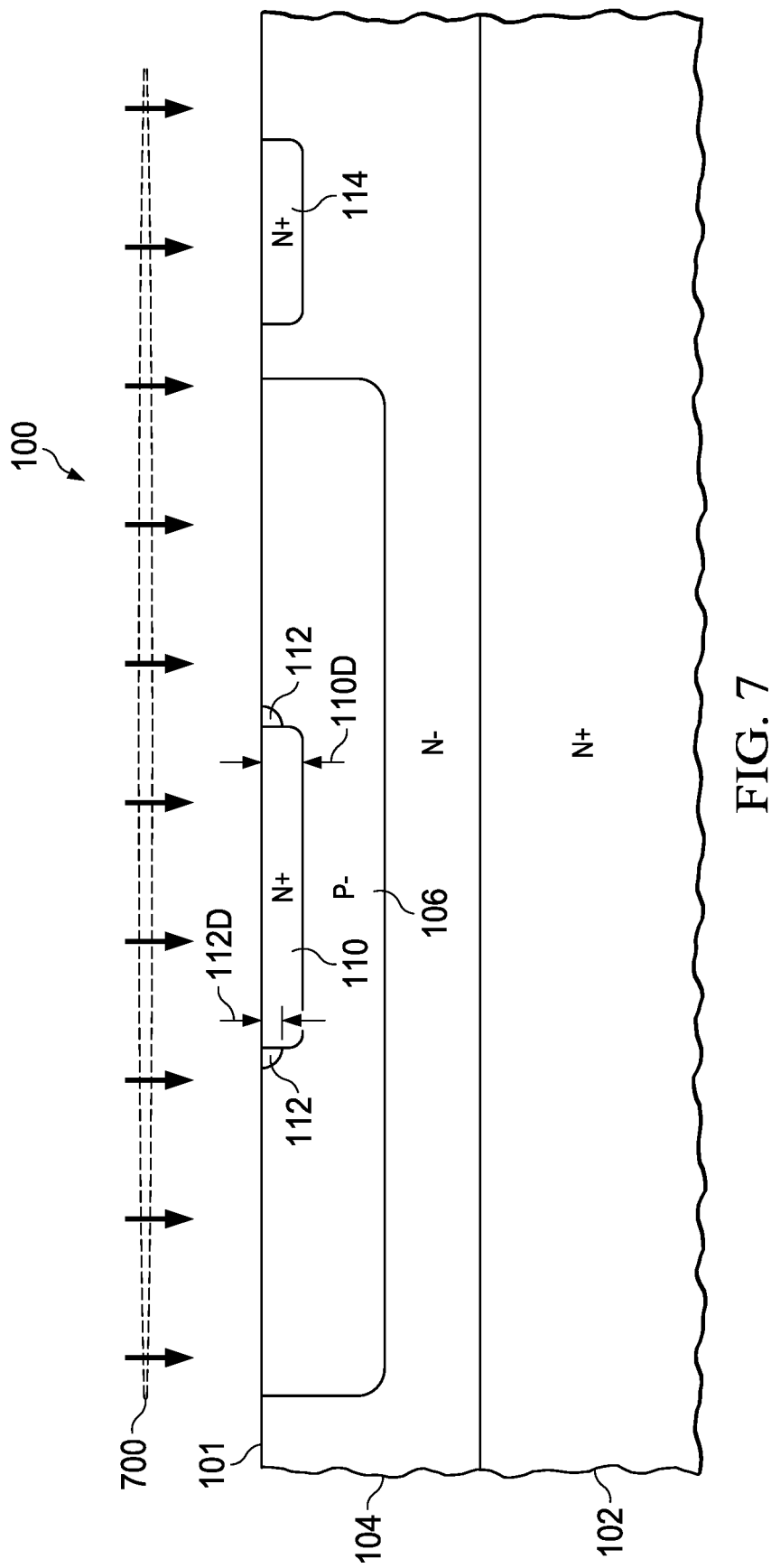

At 220a, first and second emitter regions 110 and 112 are formed. In this example, the emitter structure is formed by implanting N-type dopants (e.g., phosphorus) to form the first emitter region 110 extending downward into the first region 106 and abutting the top surface 101 in FIG. 5, an implantation process 500 and an implant mask 502 are used to form the first emitter region 110. In this example, moreover, the mask 502 exposes the first region 110 as well as a collector region 114, which is concurrently implanted at 223. In other examples, the collector region 114 can be separately formed. At 224, the second emitter region or regions 112 is/are implanted using an implantation process 600 and a second mask 602 as shown in FIG. 6. The implanted second region or regions 112 extend downward into the first region 106 along the lateral edge or edges of the first emitter region 110. In this example, separate first and second emitter implantation masks 502 and 602 are used, with the second emitter implantation mask 602 providing a larger window than the first mask 502 in order to provide the second emitter regions 112 extending laterally outward from the center of the implanted first emitter region 110. In one example, the implantation energy of the implantation process 500 to form the first emitter region 110 is higher than the implantation energy of the second emitter implantation process 600. This provides the initial first emitter region to a larger depth than the depth of the second emitter region or regions 112 as shown in FIG. 6. In addition, the implantation dose provided by the first emitter implantation process 500 is one or two orders of magnitude greater than the implantation dose of the second emitter implantation process 600. For example, the dose of the first process 500 in one example is on the order of $10^{13}$ and the dose of the second process 600 is on the order of $10_{11}$ to $10^{12}$ to form the N− lightly doped regions 112 in one example. The first and second emitter dopants are then diffused at 226 in FIG. 2 using a diffusion process 700 and FIG. 7. In one example, assuming no significant further thermal processing of the IC, the diffusion process at 226 sets the depths 110D and 112D of the respective first and second emitter portions 110 and 112 as shown in FIG. 7.

Figure 8:
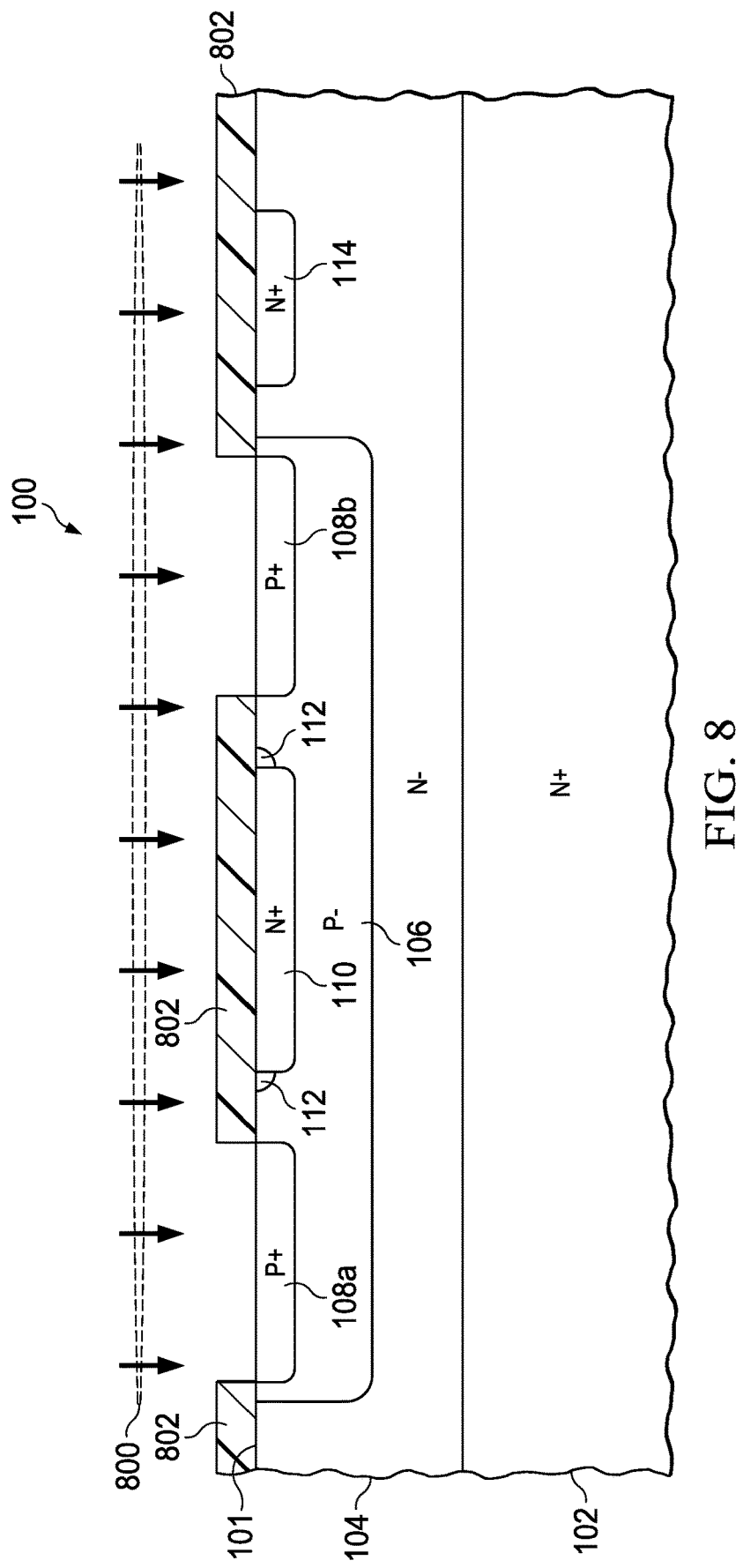

Continuing at 228 in FIG. 2, P-type dopants are implanted to form the base regions 108a and 108b that extend downward into the first region 106 from the top surface 101 and abut the top surface 101. The doping concentration of the base regions 108 (P+) in one example is greater than the doping concentration of the first region 106 (P−). FIG. 8 shows this processing using a mask 802 having openings to form the respective first and second base regions 108a and 108b via an implantation process 800. An anneal or other diffusion process is then performed at 230 to diffuse the base dopants of the regions 108. A base oxide is formed at 232 (e.g., oxide 120 in FIG. 1), and contacts are formed at 234 for the emitter, base and optionally the collector (e.g., contacts 122, 124 and 126 in FIG. 1. At 236 in FIG. 2, metallization and other backend processing is performed to provide the metallization structure 130, 140 and 150 including the passivation layer 160 as shown in FIG. 1.

Figure 9:
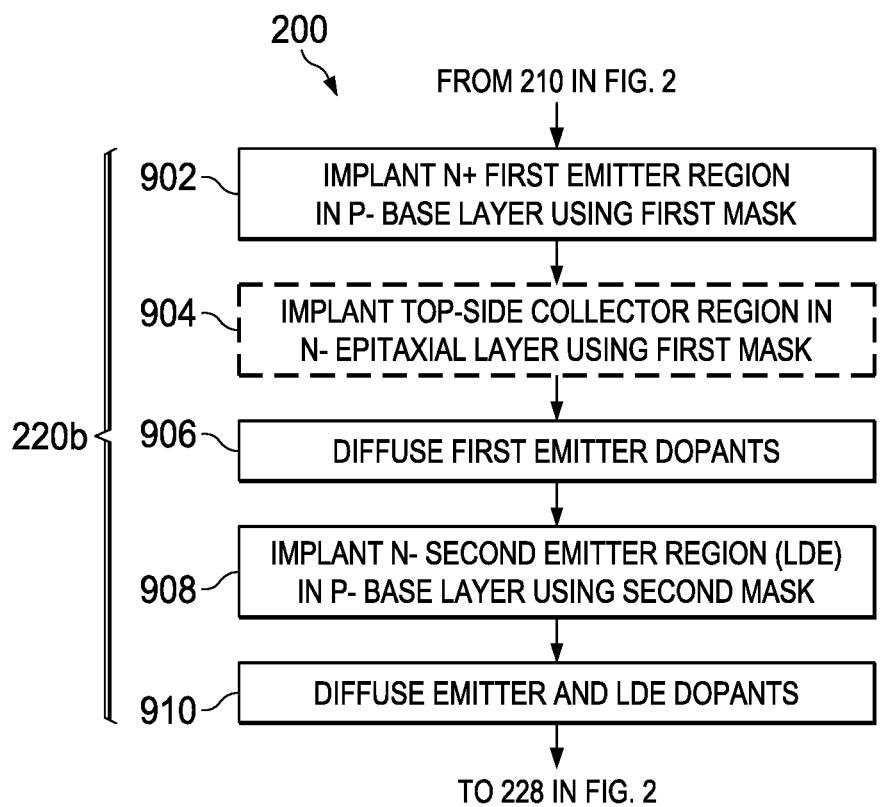
FIG. 9 is a flow diagram illustrating alternative steps to form the first and second emitter regions of the bipolar transistor.
Figure 14:
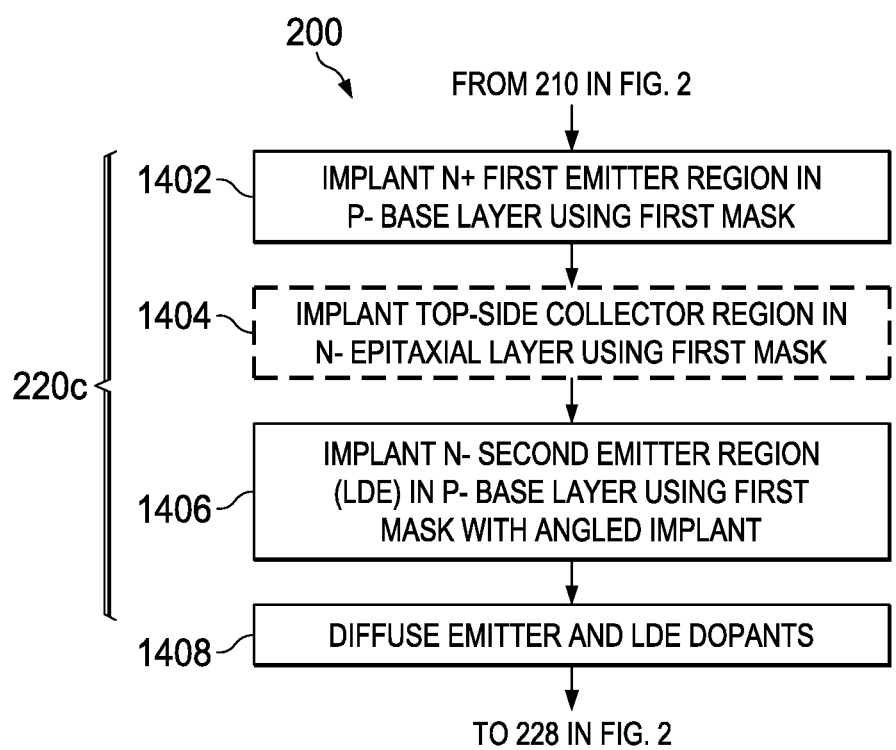
FIG. 14 is a flow diagram illustrating another alternative to form the first and second emitter regions of the bipolar transistor.
Figure 10:
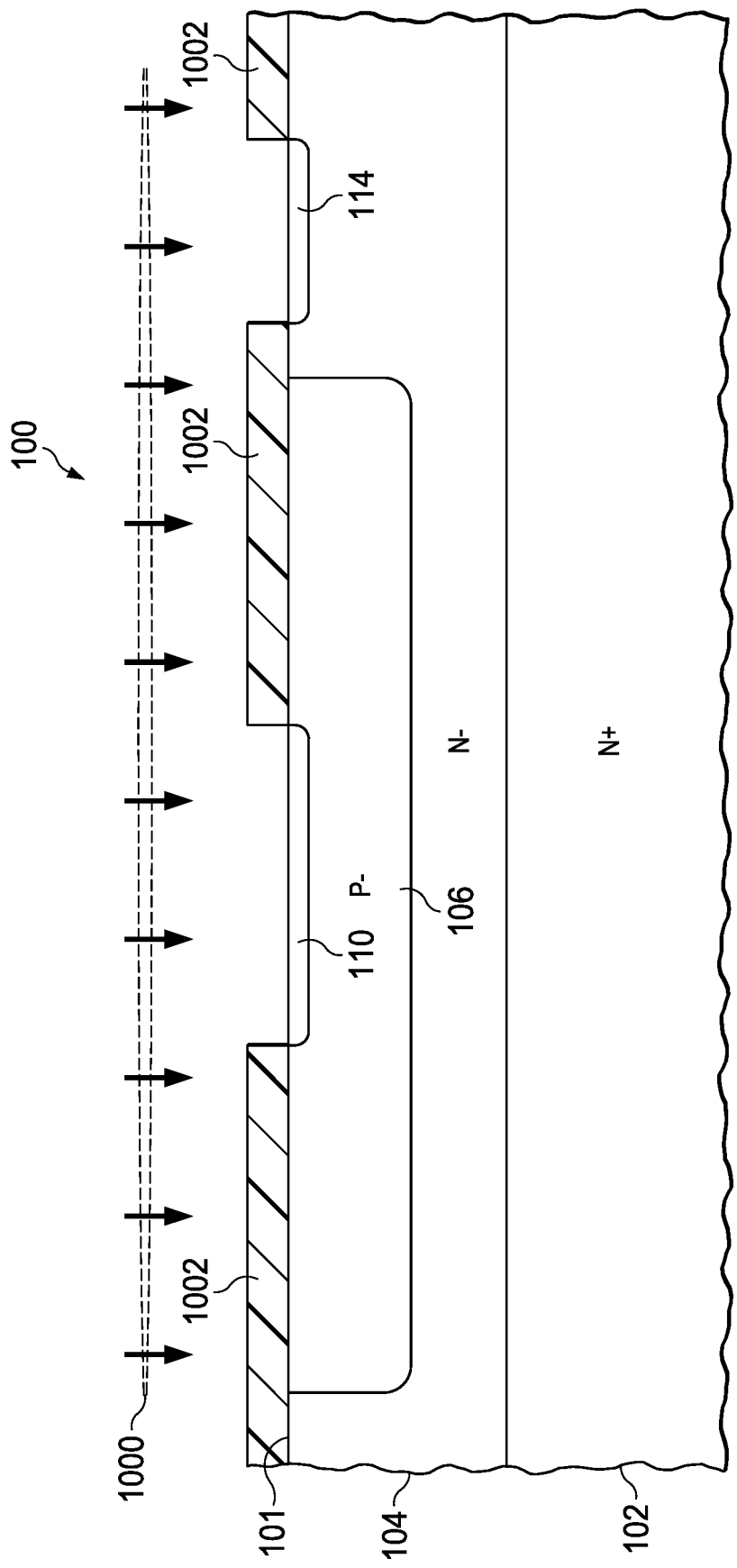
FIGS. 10-13 are partial sectional side elevation views of a radiation hardened NPN bipolar transistor undergoing fabrication processing to form the first and second emitter regions according to the method of FIG. 9.
Figure 11:
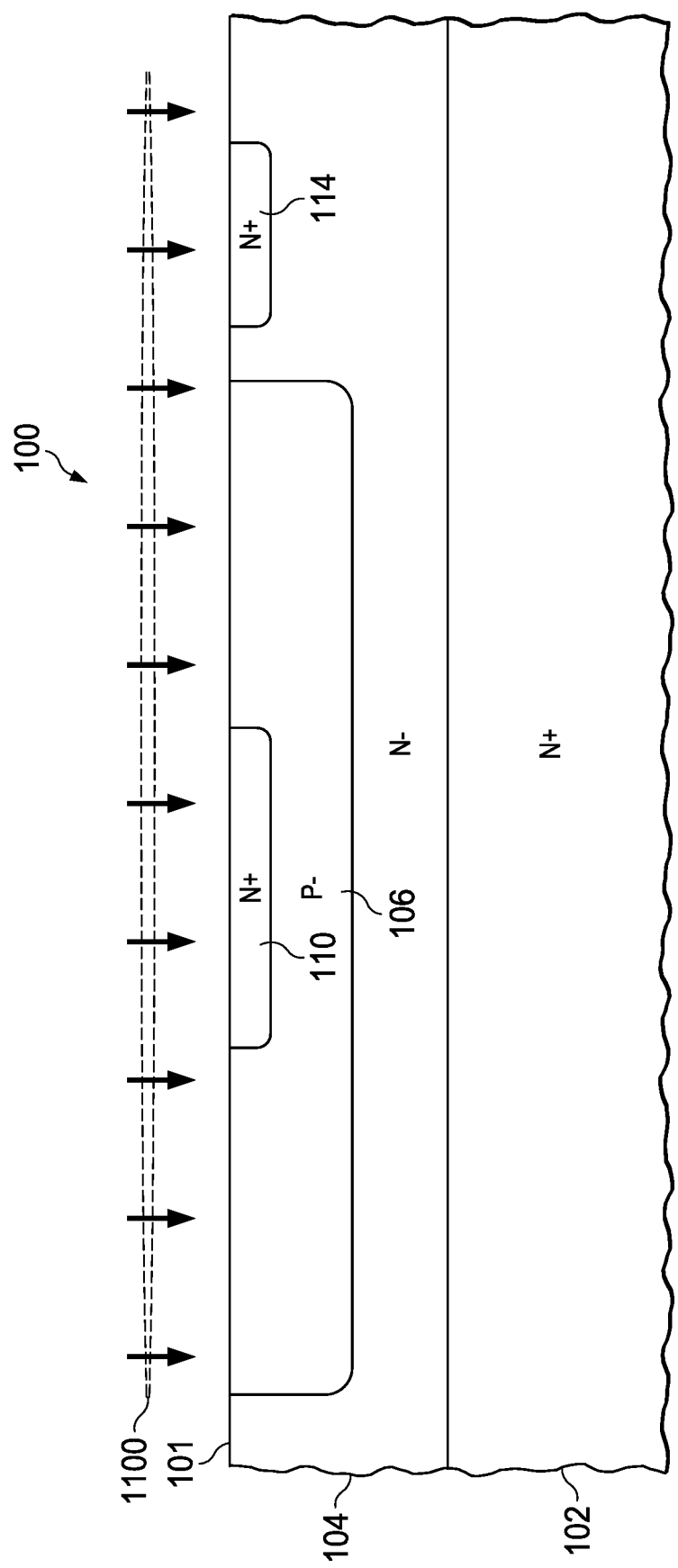
Figure 12:
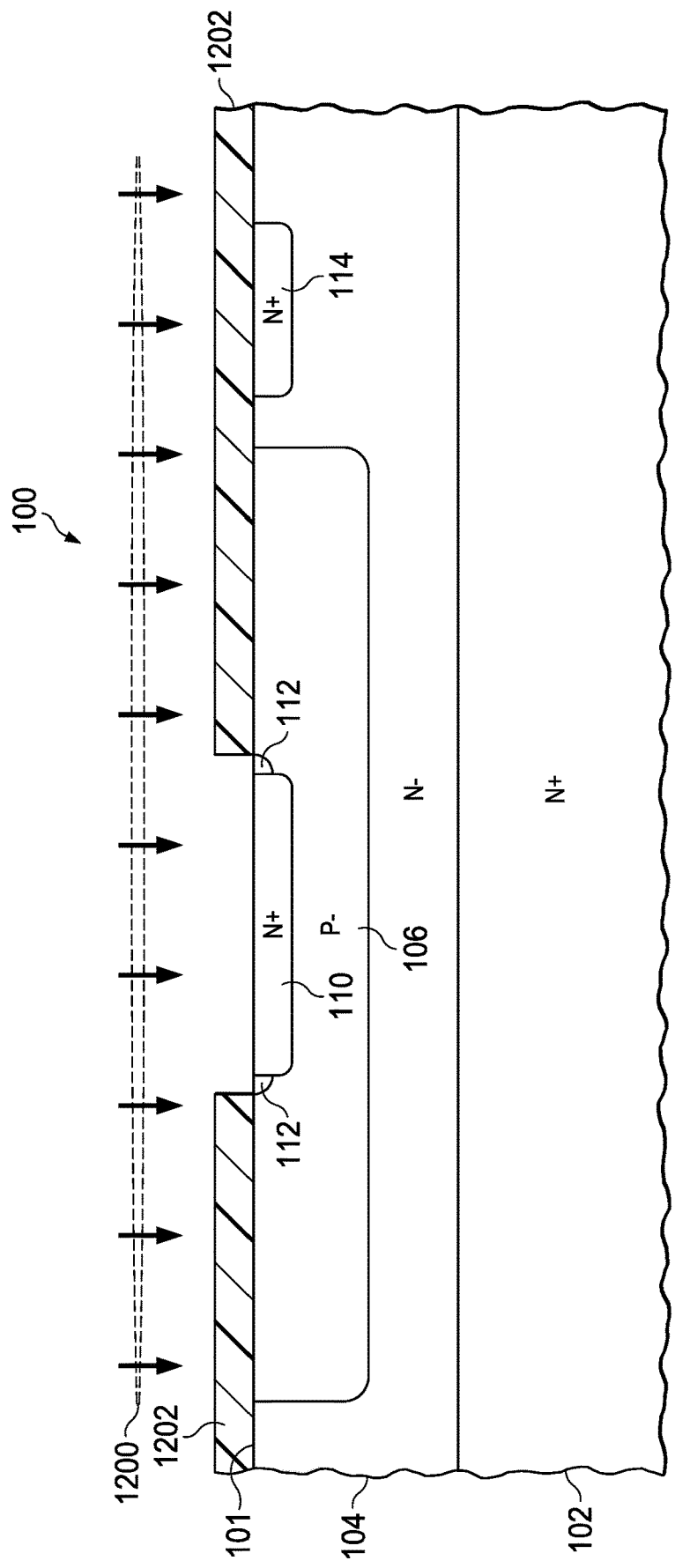
Figure 13:
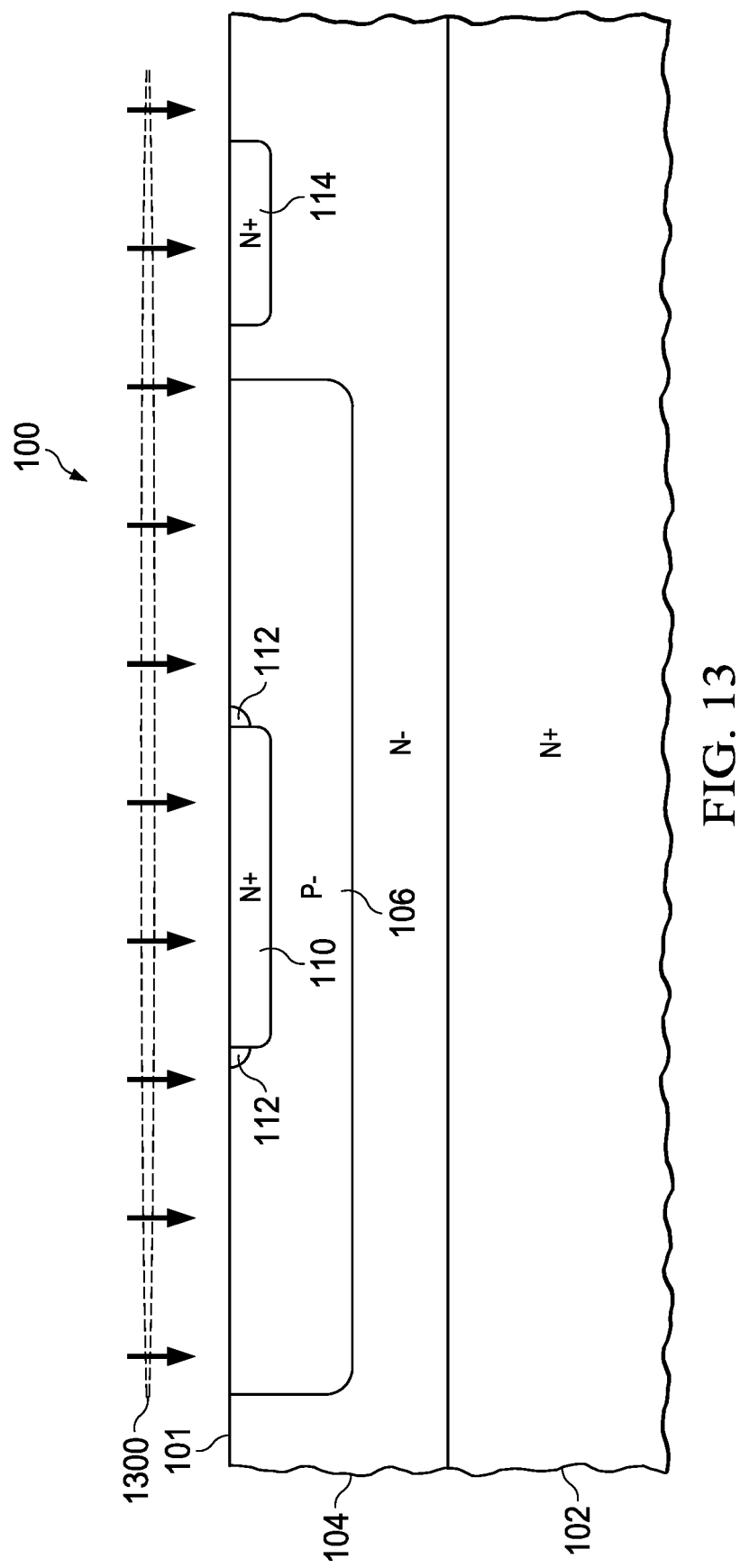

Referring now to FIGS. 9-13, in another example, the first and second emitter implantations are separately diffused. FIG. 9 shows alternative steps 220b to form the first and second emitter regions of the transistor 100 in FIG. 1, and FIGS. 10-13 show the transistor 100 at various stages of fabrication processing according to the method of FIG. 9. The processing 220b of FIG. 9 can be substituted for the processing 220a in the process 200 of FIG. 2 above. At 902 in FIG. 9, the first emitter region 110 is formed by implantation of N-type dopants (e.g., phosphorus) in the first layer 106. FIG. 10 shows this processing using a mask 1002 and an implantation process 1000 to form the first emitter region 110, and to also concurrently form the collector region 114 (904 in FIG. 9). Continuing at 906, the emitter dopants (e.g., and the collector dopants) are diffused using a diffusion process 1100 shown in FIG. 11. At 908, the second emitter region or regions 112 are formed by implanting N-type dopants in the first region 106, illustrated in FIG. 12 as an implantation process 1200 using a second implantation mask 1202. Thereafter at 910, the emitter and lightly doped second emitter dopants are diffused at 910 using a diffusion process 1300 shown in FIG. 13.

Figure 15:
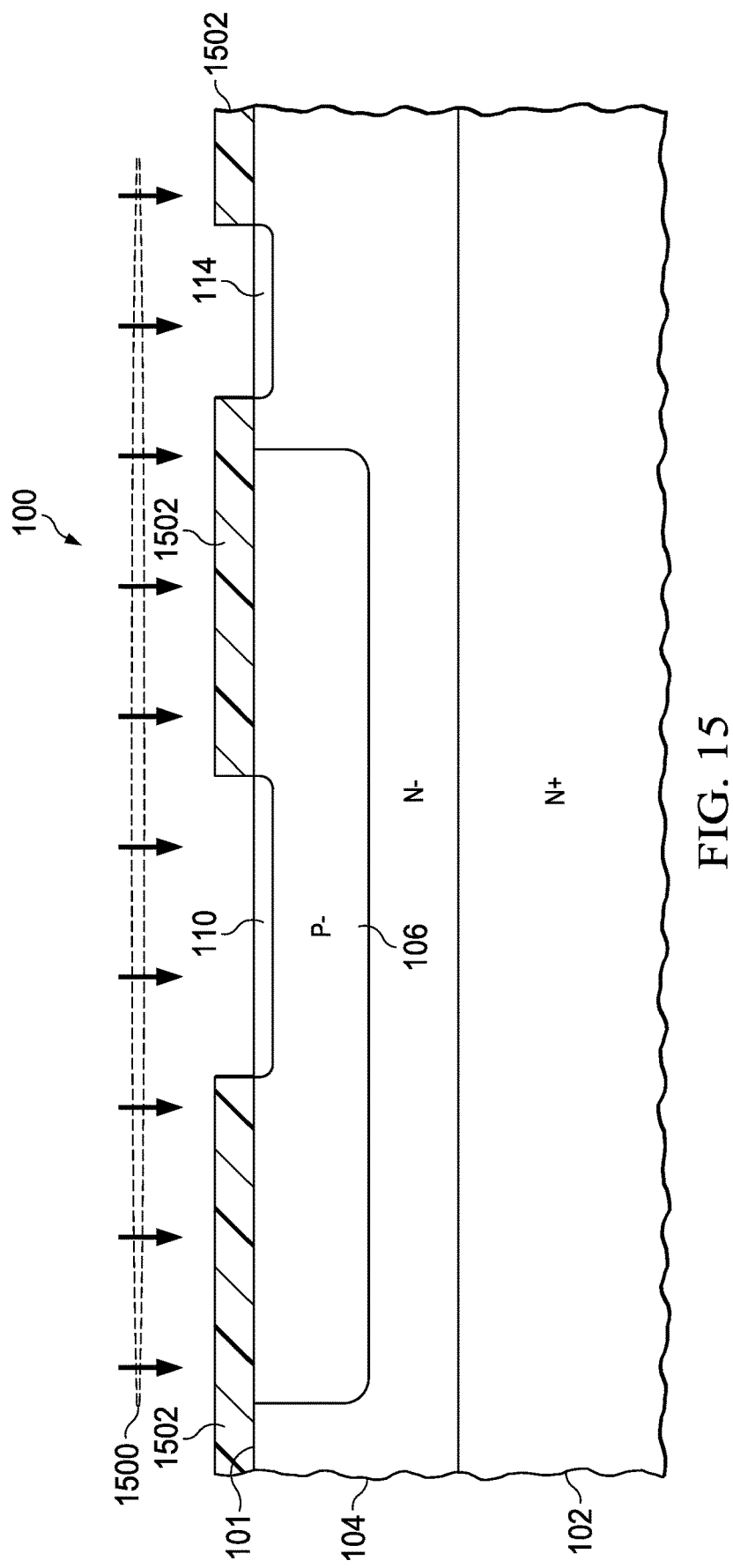
FIGS. 15-18 are partial sectional side elevation views of a radiation hardened NPN bipolar transistor undergoing fabrication processing to form the first and second emitter regions according to the method of FIG. 14.
Figure 16:
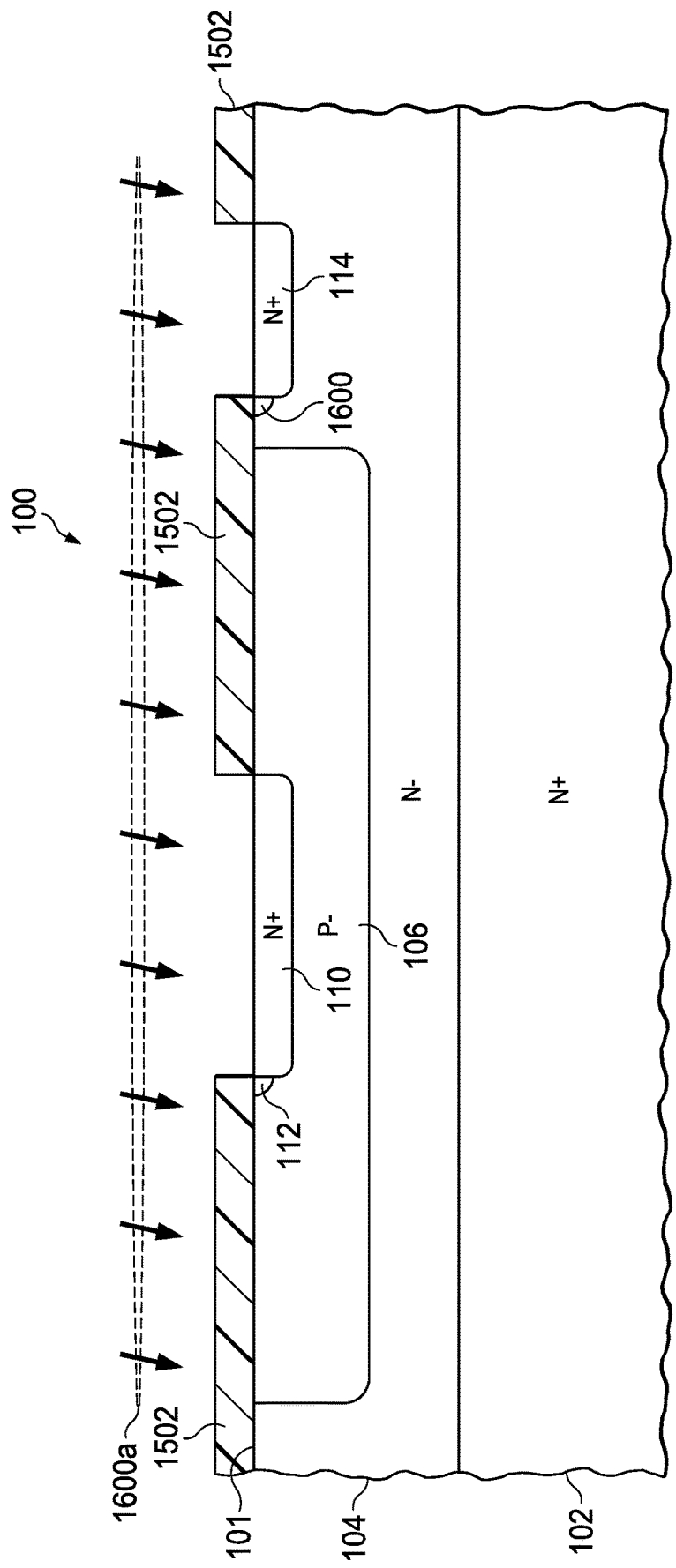
Figure 17:
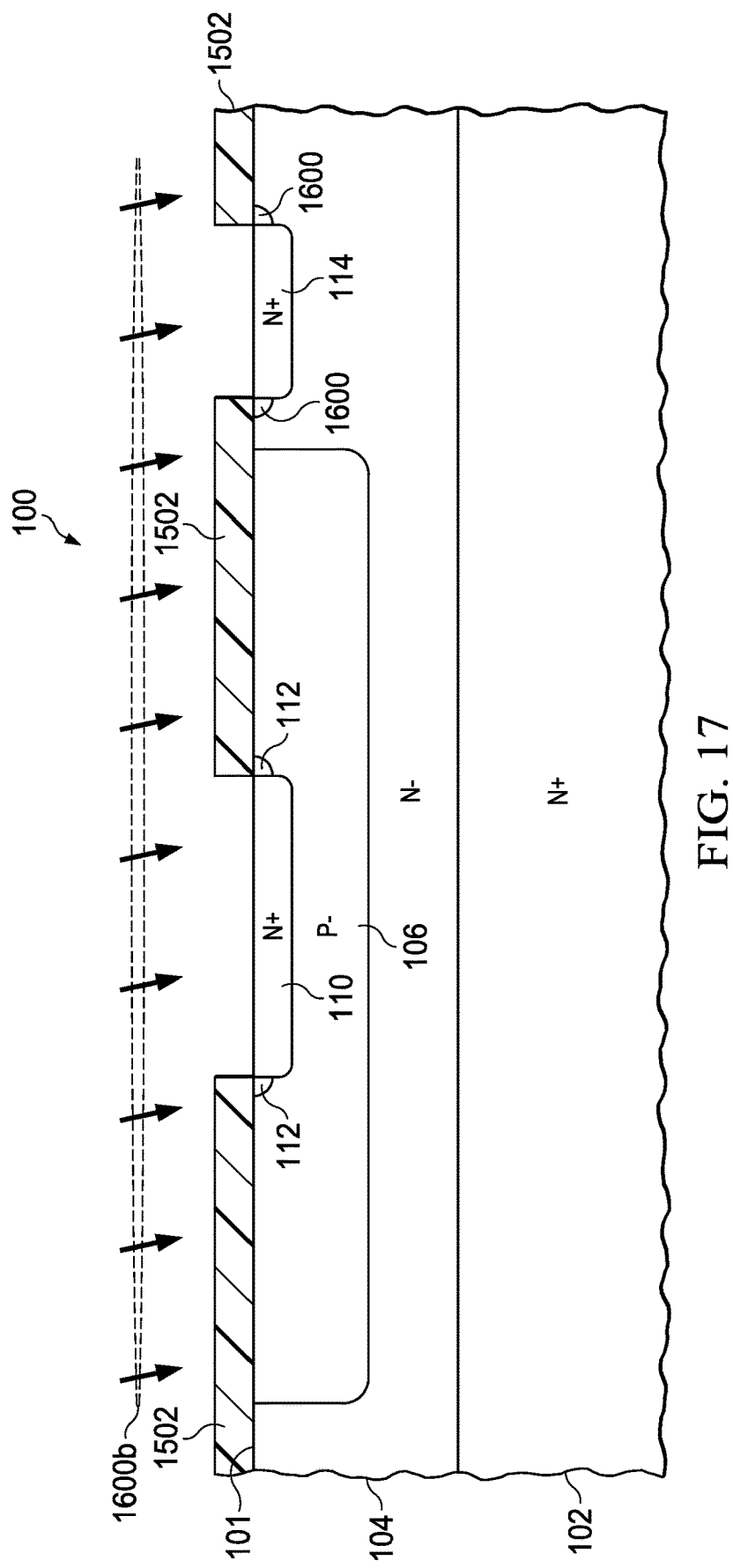
Figure 18:
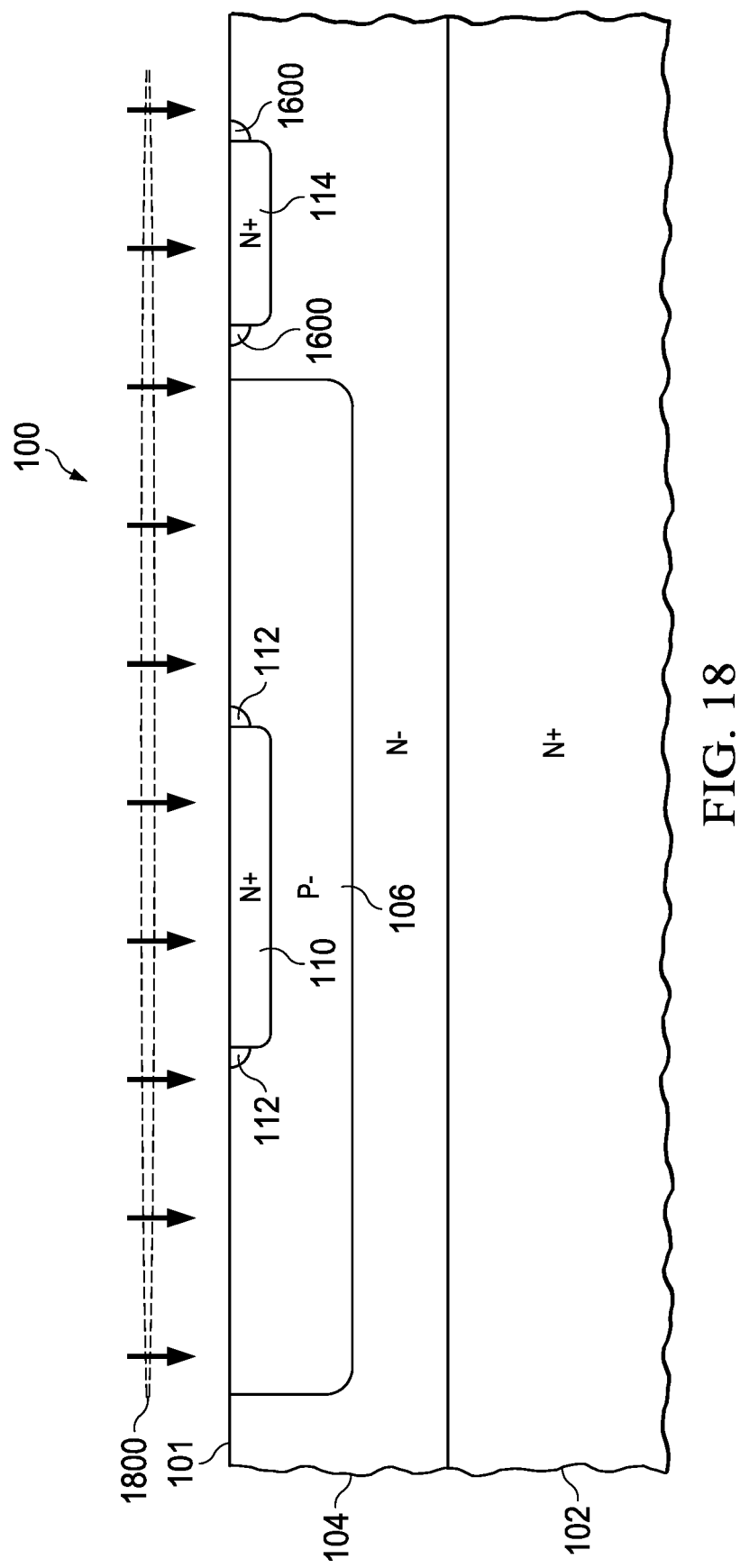

FIGS. 14-18 illustrate another example of first and second emitter region formation using processing 220c (FIG. 5) substituted for the processing 220a in the process 200 of FIG. 2. In this example, the processing 220c begins in FIG. 14 with implantation of N-type dopants to form the first emitter region 110 in the P− a slayer (first region) 106. FIG. 15 shows this processing using a first mask 1502 with openings for the first emitter region 110 as well as for the implanting collector region 114 (at 1404 in FIG. 4) using an implantation process 1500 (e.g., boron dopants in one example). In this example, moreover, the second emitter region or regions 112 is/are formed at 1406 of FIG. 14 using a quad or angled implant process 1600a, 1600b shown in FIGS. 16 and 17. In one example, the angled implantation process 1600 is performed using the same mask 1502 used in forming the first emitter region 110. This provides the second implanted emitter region or regions 112 along the lateral upper sides of the first emitter region 110. Where a single mask 1502 is used, moreover, the implantation processing 1600a, 1600b in one example also provides lightly doped regions 1600 along the upper lateral sides of the implanted collector region 1400 as shown in FIG. 17. In other examples, where a single region 108 is used, the angled implantation process 1600 need not form lightly doped emitter regions 1200 on both lateral sides of the first emitter region 110, and may only provide a lightly doped region 1200 along the upper side of the first emitter region 110 that faces the single base region 108, or lightly doped regions 1200 can be provided along both lateral sides of the first emitter region 110 (e.g., FIGS. 19 and 21). At 1408 in FIG. 14, the first and second emitter dopants (emitter and LDE dopants) are diffused using a diffusion process 1800 shown in FIG. 18.

FIG. 19 shows another example integrated circuit with a radiation hardened NPN bipolar transistor 100 having a single P+ base region 108 laterally disposed between the emitter regions 110, 112 and the implanted collector region 114. In this case, lightly doped (e.g., N−) second emitter regions 112 are formed on both lateral sides of the first emitter region 110. In an alternate implementation, a single second emitter region 112 can be formed on the upper lateral right side of the first emitter region 110 facing the single base region 108.

FIG. 20 shows another example integrated circuit with a radiation hardened NPN bipolar transistor 100 including first and second P+ base regions on opposite lateral sides of the first and second emitter regions 110, 112. In this case, the collector is not implanted into the top side of the substrate structure 102, 104, and instead the lower N+ and N− regions 102, 104 provide the transistor collector as schematically shown in FIG. 20. In this case, where the transistor 100 is formed in an integrated circuit having other circuitry, the collector connection can be made via the substrate 102, 104 two other circuits (not shown). Where an external connection is required for the transistor collector, a bottom side contact can be formed (not shown).

FIG. 21 illustrates a further radiation hardened NPN bipolar transistor example 100. In this case, the transistor 100 includes a single base region 108 along with a bottom side collector provided by the N+ and N− substrate structure 102, 104.

Figure 22:
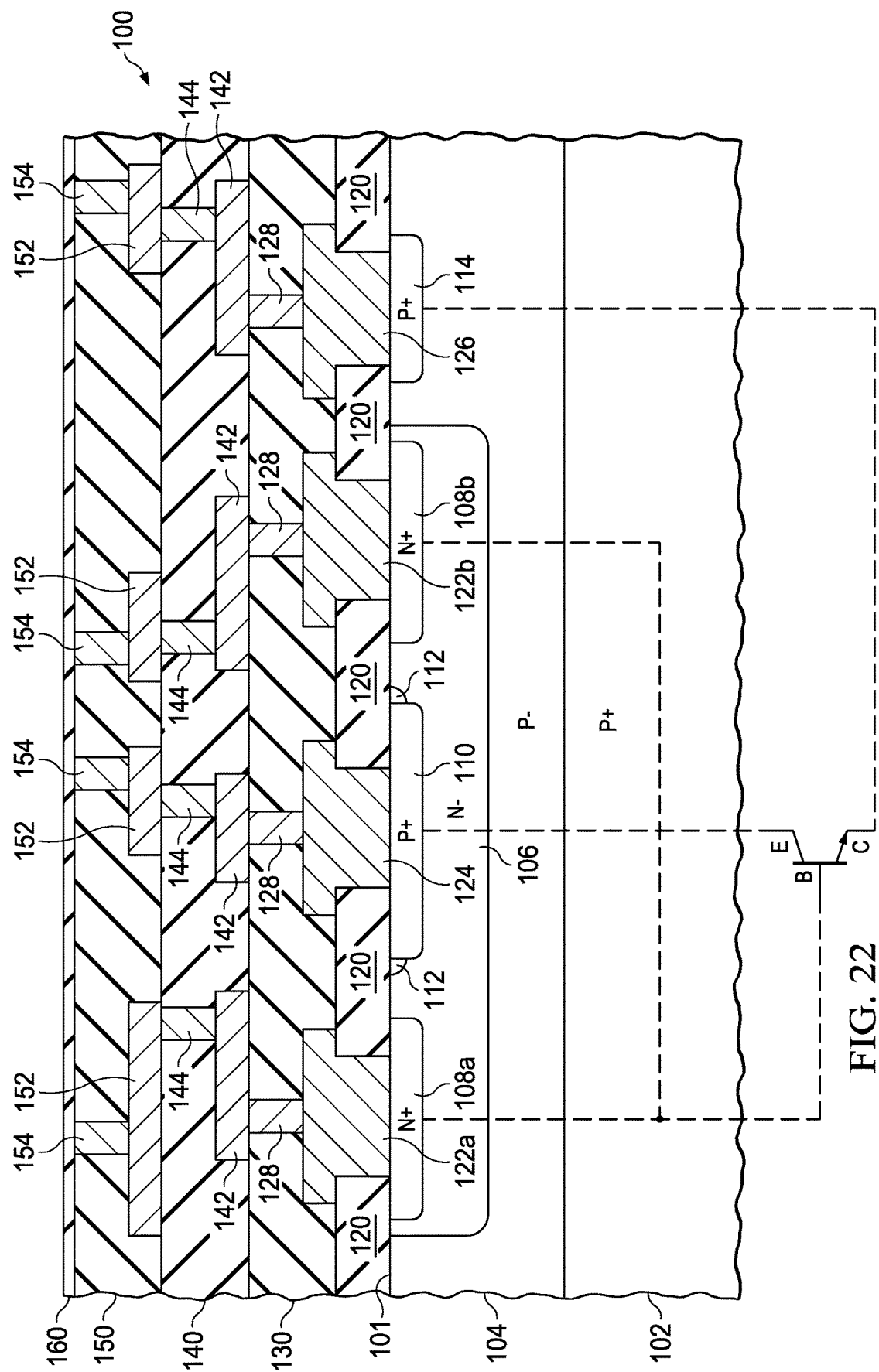
FIG. 22 is a partial sectional side elevation view of another example integrated circuit with a radiation hardened PNP bipolar transistor including first and second base regions, first and second emitter regions and a top side collector.

FIG. 22 shows a radiation hardened lateral PNP transistor 100 in which the conductivity types (N and P) are reversed relative to the NPN transistor 100 of FIG. 1 above.

In still another non-limiting example, the second emitter region (LDE) can be formed after the intrinsic base formation at 228 in FIG. 2. For example, an LDE mask is formed after the intrinsic base is formed at 228, and an N− implant is performed to form the second emitter region, prior to the anneal at 230 which diffuses the P+ extrinsic base dopants as well as the N− LDE dopants.

The above examples are merely illustrative of several possible embodiments of various aspects of the present disclosure, wherein equivalent alterations and/or modifications will occur to others skilled in the art upon reading and understanding this specification and the annexed drawings. Modifications are possible in the described embodiments, and other embodiments are possible, within the scope of the claims.

The following is claimed:
1. A bipolar transistor, comprising:
 a semiconductor substrate, including a top surface;
 a first region of a first conductivity type extending downward into the substrate from the top surface, the first region having a first doping concentration;
 a collector region of a second conductivity type disposed in the substrate;
 a first base region of the first conductivity type extending downward into the first region from the top surface and abutting the top surface, the first base region having a second doping concentration greater than the first doping concentration;
a second base region of the first conductivity type extending downward into the first region from the top surface and abutting the top surface, the second base region having the second doping concentration;
a first emitter region of the second conductivity type extending downward a first distance into the first region and abutting the top surface, the first emitter region having a third doping concentration, the first emitter region including a first lateral side spaced from and facing the base region, wherein the first emitter region includes a second lateral side spaced from and facing the second base region; and
a second emitter region of the second conductivity type extending downward a second distance, which is less than the first distance, into the first region, the second emitter region abutting the top surface and abutting an upper portion of the first lateral side of the first emitter region, the second emitter region having a fourth doping concentration less than the third doping concentration, wherein the second emitter region abuts an upper portion of the second lateral side of the first emitter region.

2. The bipolar transistor of claim 1, wherein the first conductivity type is P, and the second conductivity type is N, and wherein the bipolar transistor is an NPN transistor.

3. A bipolar transistor, comprising:
a semiconductor substrate, including a top surface;
a first region of a first conductivity type extending downward into the substrate from the top surface, the first region having a first doping concentration;
a collector region of a second conductivity type disposed in the substrate, wherein the collector region extends downward into the substrate from the top surface, the collector region being laterally spaced from the first region;
a base region of the first conductivity type extending downward into the first region from the top surface and abutting the top surface, the base region having a second doping concentration greater than the first doping concentration;
a second base region of the first conductivity type extending downward into the first region from the top surface and abutting the top surface, the second base region having the second doping concentration;
a first emitter region of the second conductivity type extending downward into the first region and abutting the top surface, the first emitter region having a third doping concentration, the first emitter region including a first lateral side spaced from and facing the base region, wherein the first emitter region includes a second lateral side spaced from and facing the second base region; and
a second emitter region of the second conductivity type extending downward into the first region, the second emitter region abutting the top surface and abutting an upper portion of the first lateral side of the first emitter region, the second emitter region having a fourth doping concentration less than the third doping concentration, wherein the second emitter region abuts an upper portion of the second lateral side of the first emitter region;
a conductive first base contact abutting the base region above the top surface;
a conductive second base contact abutting the second base region above the top surface;
a conductive emitter contact abutting the first emitter region above the top surface; and
a conductive collector contact abutting the collector region above the top surface.

4. A bipolar transistor, comprising:
a semiconductor substrate, including a top surface;
a first region of a first conductivity type extending downward into the substrate from the top surface, the first region having a first doping concentration;
a collector region of a second conductivity type disposed in the substrate;
a base region of the first conductivity type abutting the top surface and extending downward into the first region from the top surface, the base region having a second doping concentration greater than the first doping concentration;
a second base region of the first conductivity type abutting the top surface and extending downward into the first region from the top surface, the second base region having the second doping concentration;
a first emitter region of the second conductivity type extending downward from the top surface into the first region to a first depth and abutting the top surface, the first emitter region having a third doping concentration, the first emitter region including a first lateral side spaced from and facing the base region and a second lateral side spaced from and facing the second base region; and
a second emitter region extending downward from the top surface into the first region to a second depth which is less than the first depth, the second emitter region abutting the top surface and abutting an upper portion of the first lateral side of the first emitter region and an upper portion of the second lateral side of the first emitter region, the second emitter region having a fourth doping concentration less than the third doping concentration.

5. An integrated circuit (IC), comprising:
a semiconductor substrate, including a top surface;
a first region of a first conductivity type extending downward into the substrate from the top surface, the first region having a first doping concentration;
a collector region of a second conductivity type disposed in the substrate;
a base region of the first conductivity type extending downward into the first region from the top surface and abutting the top surface, the base region having a second doping concentration greater than the first doping concentration;
a second base region of the first conductivity type extending downward into the first region from the top surface and abutting the top surface, the second base region having the second doping concentration;
a conductive base contact abutting the base region above the top surface;
a first emitter region of the second conductivity type extending downward a first distance into the first region and abutting the top surface, the first emitter region having a third doping concentration, the first emitter region including a first lateral side spaced from and facing the base region and a second lateral side spaced from and facing the second base region;
a conductive emitter contact abutting the first emitter region above the top surface; and a second emitter region of the second conductivity type extending downward a second distance, which is less than the first distance, into the first region, the second emitter region abutting the top surface and abutting an upper portion of the first and second lateral sides of the first emitter region, the second emitter region having a fourth doping concentration less than the third doping concentration.

6. A bipolar transistor, comprising:
a semiconductor substrate, including a top surface;
a first region of a first conductivity type, different than a conductivity type of the substrate, extending downward into the substrate from the top surface, the first region having a first doping concentration;
a collector region of a second conductivity type disposed in the substrate;
a first base region of the first conductivity type extending downward into the first region from the top surface and abutting the top surface, the first base region having a second doping concentration greater than the first doping concentration;
a second base region of the first conductivity type extending downward into the first region from the top surface and abutting the top surface, the second base region having the second doping concentration;
a first emitter region of the second conductivity type extending downward into the first region and abutting the top surface, the first emitter region having a third doping concentration, the first emitter region including a first lateral side spaced from and facing the base region, wherein the first emitter region includes a second lateral side spaced from and facing the second base region; and
a second emitter region of the second conductivity type extending downward into the first region, the second emitter region abutting the top surface and abutting an upper portion of the first lateral side of the first emitter region, the second emitter region having a fourth doping concentration less than the third doping concentration, wherein the second emitter region abuts an upper portion of the second lateral side of the first emitter region.

7. An integrated circuit (IC), comprising:
a semiconductor substrate, including a top surface;
a first region of a first conductivity type, different than a conductivity type of the substrate, extending downward into the substrate from the top surface, the first region having a first doping concentration;
a collector region of a second conductivity type disposed in the substrate;
a first base region of the first conductivity type extending downward into the first region from the top surface and abutting the top surface, the first base region having a second doping concentration greater than the first doping concentration;
a second base region of the first conductivity type extending downward into the first region from the top surface and abutting the top surface, the second base region having the second doping concentration;
a conductive base contact abutting the base region above the top surface;
a first emitter region of the second conductivity type extending downward into the first region and abutting the top surface, the first emitter region having a third doping concentration, the first emitter region including a first lateral side spaced from and facing the base region, wherein the first emitter region includes a second lateral side spaced from and facing the second base region;
a conductive emitter contact abutting the first emitter region above the top surface; and
a second emitter region of the second conductivity type extending downward into the first region, the second emitter region abutting the top surface and abutting an upper portion of the first lateral side of the first emitter region, the second emitter region having a fourth doping concentration less than the third doping concentration, wherein the second emitter region abuts an upper portion of the second lateral side of the first emitter region.

8. A bipolar transistor, comprising:
a semiconductor substrate, including a top surface;
a first region of a first conductivity type extending downward into the substrate from the top surface, the first region having a first doping concentration;
a collector region of a second conductivity type disposed in the substrate;
a base region of the first conductivity type extending downward from the top surface into but not through the first region and abutting the top surface, the base region having a second doping concentration greater than the first doping concentration;
a first emitter region of the second conductivity type extending downward a first distance into the first region and abutting the top surface, the first emitter region having a third doping concentration, the first emitter region including a first lateral side spaced from and facing the base region; and
a second emitter region of the second conductivity type extending downward a second distance, which is less than the first distance, into the first region, the second emitter region abutting the top surface and abutting an upper portion of the first lateral side of the first emitter region, the second emitter region having a fourth doping concentration less than the third doping concentration.

9. A bipolar transistor, comprising:
a semiconductor substrate, including a top surface;
a first region of a first conductivity type extending downward into the substrate from the top surface, the first region having a first doping concentration;
a collector region of a second conductivity type disposed in the substrate;
a base region of the first conductivity type abutting the top surface and extending from the top surface downward into but not through the first region, the base region having a second doping concentration greater than the first doping concentration;
a first emitter region of the second conductivity type extending downward from the top surface into the first region to a first depth and abutting the top surface, the first emitter region having a third doping concentration, the first emitter region including a first lateral side spaced from and facing the base region; and
a second emitter region of the second conductivity type extending downward from the top surface into the first region to a second depth which is less than the first depth and abutting the top surface and an upper portion of the first lateral side of the first emitter region, the second emitter region having a fourth doping concentration less than the third doping concentration.

10. An integrated circuit (IC), comprising:
a semiconductor substrate, including a top surface;
a first region of a first conductivity type extending downward into the substrate from the top surface, the first region having a first doping concentration;
a collector region of a second conductivity type disposed in the substrate;
a base region of the first conductivity type extending downward from the top surface into but not through the first region and abutting the top surface, the base region having a second doping concentration greater than the first doping concentration;
a conductive base contact abutting the base region above the top surface;
a first emitter region of the second conductivity type extending downward a first distance into the first region and abutting the top surface, the first emitter region having a third doping concentration, the first emitter region including a first lateral side spaced from and facing the base region;
a conductive emitter contact abutting the first emitter region above the top surface; and
a second emitter region of the second conductivity type extending downward a second distance, which is less than the first distance, into the first region, the second emitter region abutting the top surface and abutting an upper portion of the first lateral side of the first emitter region. the second emitter region having a fourth doping concentration less than the third doping concentration.

11. An integrated circuit (IC), comprising:
a semiconductor substrate, including a top surface;
a first region of a first conductivity type extending downward into the substrate from the top surface, the first region having a first doping concentration;
a collector region of a second conductivity type extending downward into the substrate from the top surface, the collector region being laterally spaced from the first region;
a base region of the first conductivity type extending from the top surface downward into but not through the first region and abutting the top surface, the base region having a second doping concentration greater than the first doping concentration;
a conductive base contact abutting the base region above the top surface;
a first emitter region of the second conductivity type extending downward into the first region and abutting the top surface, the first emitter region having a third doping concentration. the first emitter region including a first lateral side spaced from and facing the base region;
a conductive emitter contact abutting the first emitter region above the top surface;
a second emitter region of the second conductivity type extending downward into the first region, the second emitter region abutting the top surface and abutting an upper portion of the first lateral side of the first emitter region, the second emitter re gion having a fourth doping concentration less than the third doping;
a conductive collector contact abutting the collector region above the top surface; and
a metallization structure disposed over the top surface of the substrate, the metallization structure including conductive structures to allow external connection to the collector contact, the base contact and the emitter contact.

12. An integrated circuit (IC), comprising:
a semiconductor substrate, including a top surface;
a first region of a first conductivity type extending downward into the substrate from the top surface, the first region having a first doping concentration;
a collector region of a second conductivity type disposed in the substrate;
a base region of the first conductivity type extending from the top surface downward into but not through the first region and abutting the top surface, the base region having a second doping concentration greater than the first doping concentration;
a conductive base contact abutting the base region above the top surface;
a first emitter region of the second conductivity type abutting the top surface and extending downward from the top surface into the first region to a first depth, the first emitter region having a third doping concentration, the first emitter region including a first lateral side spaced from and facing the base region;
a conductive emitter contact abutting the first emitter region above the top surface; and
a second emitter region of the second conductivity type extending downward from the top surface into the first region to a second depth wherein the second depth is less than the first depth, the second emitter region abutting the top surface and abutting an upper portion of the first lateral side of the first emitter region, the second emitter region having a fourth doping concentration less than the third doping concentration.

13. A semiconductor structure, comprising:
a semiconductor substrate, including a top surface;
a first region of a first conductivity type extending downward into the substrate from the top surface, the first region having a first doping concentration;
a second region of a second conductivity type disposed in the substrate;
a third region of the first conductivity type extending from the top surface downward into but not through the first region and abutting the top surface, the third region having a second doping concentration greater than the first doping concentration;
a fourth region of the second conductivity type extending downward into the first region and abutting the top surface, the fourth region having a third doping concentration, the fourth region including a first lateral side spaced from and facing the third region; and
a fifth region of the second conductivity type extending downward into the first region, the fifth region abutting the top surface and abutting an upper portion of the first lateral side of the fourth region, the fifth region having a fourth doping concentration less than the third doping concentration.

14. A bipolar transistor, comprising:
a semiconductor substrate, including a top surface;
a first region of a first conductivity type, different than a conductivity type of the substrate, extending downward into the substrate from the top surface, the first region having a first doping concentration;
a collector region of a second conductivity type disposed in the substrate;
a base region of the first conductivity type extending from the top surface downward into but not through the first region and abutting the top surface, the base region having a second doping concentration greater than the first doping concentration;

a first emitter region of the second conductivity type extending downward into the first region and abutting the top surface, the first emitter region having a third doping concentration, the first emitter region including a first lateral side spaced from and facing the base region; and a second emitter region of the second conductivity type extending downward into the first region, the second emitter region abutting the top surface and abutting an upper portion of the first lateral side of the first emitter region. the second emitter region having a fourth doping concentration less than the third doping concentration.

15. An integrated circuit (IC), comprising:

a semiconductor substrate, including a top surface;

a first region of a first conductivity type, different than a conductivity type of the substrate, extending downward into the substrate from the top surface, the first region having a first doping concentration;

a collector region of a second conductivity type disposed in the substrate;

a base region of the first conductivity type extending from the top surface downward into but not through the first region and abutting the top surface, the base region having a second doping concentration greater than the first doping concentration;

a conductive base contact abutting the base region above the top surface;

a first emitter region of the second conductivity type extending downward into the first region and abutting the top surface, the first emitter region having a third doping concentration, the first emitter region including a first lateral side spaced from and facing the base region;

a conductive emitter contact abutting the first emitter region above the top surface; and a second emitter region of the second conductivity type extending downward into the first region, the second emitter region abutting the top surface and abutting an upper portion of the first lateral side of the first emitter region, the second emitter region having a fourth doping concentration less than the third doping concentration.

\* \* \* \* \*